United States Patent
Page

(10) Patent No.: US 9,796,140 B2
(45) Date of Patent: Oct. 24, 2017

(54) AUTOMATED SYSTEMS FOR COMPOSITE PART FABRICATION

(71) Applicant: Autodesk, Inc., San Rafael, CA (US)

(72) Inventor: James Sherwood Page, Oakland, CA (US)

(73) Assignee: Autodesk, Inc., San Rafael, CA (US)

( * ) Notice: Subject to any disclaimer, the term of this patent is extended or adjusted under 35 U.S.C. 154(b) by 35 days.

(21) Appl. No.: 14/748,135

(22) Filed: Jun. 23, 2015

(65) Prior Publication Data

US 2015/0367576 A1 Dec. 24, 2015

Related U.S. Application Data

(63) Continuation-in-part of application No. 14/745,285, filed on Jun. 19, 2015, now Pat. No. 9,533,449.

(60) Provisional application No. 62/016,011, filed on Jun. 23, 2014, provisional application No. 62/014,453, filed on Jun. 19, 2014.

(51) Int. Cl.
| | |
|---|---|
| *B29C 67/00* | (2017.01) |
| *B29C 70/30* | (2006.01) |
| *B33Y 10/00* | (2015.01) |
| *B33Y 30/00* | (2015.01) |
| *B29C 70/06* | (2006.01) |

(52) U.S. Cl.
CPC ...... *B29C 67/0085* (2013.01); *B29C 67/0055* (2013.01); *B29C 67/0059* (2013.01); *B29C 67/0081* (2013.01); *B29C 70/06* (2013.01); *B29C 70/30* (2013.01); *B33Y 10/00* (2014.12); *B33Y 30/00* (2014.12)

(58) Field of Classification Search
CPC .......................... B33Y 30/00; B29C 67/0081
See application file for complete search history.

(56) References Cited

U.S. PATENT DOCUMENTS

| | | |
|---|---|---|
| 5,303,141 A | 4/1994 | Batchelder et al. |
| 5,316,219 A | 5/1994 | Christyson et al. |
| 5,943,235 A | 8/1999 | Earl et al. |

(Continued)

FOREIGN PATENT DOCUMENTS

DE    10 2011 119 735    6/2013

OTHER PUBLICATIONS

Neri Oxman, U.S. Appl. No. 61/248,555, "Variable Property Rapid Prototyping (VPRP)," filed Oct. 5, 2009, 36 pages.

(Continued)

*Primary Examiner* — Benjamin Schiffman
(74) *Attorney, Agent, or Firm* — Fish & Richardson P.C.

(57) ABSTRACT

A method includes: providing a matrix material and a fiber material separate from the matrix material to a fused deposition modelling (FDM) three dimensional (3D) printer; and delivering the matrix material and the fiber material to a printing location of the FDM 3D printer while maintaining separation of the fiber material from the matrix material up to the printing location of the FDM 3D printer, wherein the delivering includes melting the matrix material and embedding the fiber material within the matrix material. Further, a system includes: a build platform; and two or more tools associated with the build platform; wherein the two or more tools are configured and arranged with respect to the build platform to add matrix material and fiber material in non-planar layers to build the object.

16 Claims, 38 Drawing Sheets

(56) References Cited

U.S. PATENT DOCUMENTS

| | | | |
|---|---|---|---|
| 5,960,411 | A | 9/1999 | Hartman et al. |
| 6,722,872 | B1 | 4/2004 | Swanson et al. |
| 6,749,414 | B1 | 6/2004 | Hanson et al. |
| 6,814,907 | B1 | 11/2004 | Comb |
| 7,122,246 | B2 | 10/2006 | Comb et al. |
| 7,754,807 | B2 | 7/2010 | Priedeman, Jr. et al. |
| 8,512,024 | B2 | 8/2013 | Pax |
| 9,339,974 | B2 | 5/2016 | Spalt |
| 9,533,449 | B2 | 1/2017 | Page |
| 2001/0017085 | A1 | 8/2001 | Kubo et al. |
| 2010/0021580 | A1 | 1/2010 | Swanson et al. |
| 2010/0100224 | A1 | 4/2010 | Comb et al. |
| 2011/0059256 | A1 | 3/2011 | Ebisawa |
| 2011/0079936 | A1 | 4/2011 | Oxman |
| 2014/0034214 | A1 | 2/2014 | Boyer et al. |
| 2014/0070461 | A1 | 3/2014 | Pax |
| 2014/0291886 | A1 | 10/2014 | Mark et al. |
| 2014/0328963 | A1 | 11/2014 | Mark et al. |
| 2014/0361460 | A1 | 12/2014 | Mark |
| 2015/0093465 | A1 | 4/2015 | Page |
| 2015/0108677 | A1 | 4/2015 | Mark et al. |
| 2015/0266235 | A1 | 9/2015 | Page |
| 2015/0266244 | A1 | 9/2015 | Page |
| 2015/0324490 | A1 | 11/2015 | Page |
| 2015/0367375 | A1 | 12/2015 | Page |
| 2016/0114532 | A1* | 4/2016 | Schirtzinger ........... B29C 70/30 428/411.1 |

OTHER PUBLICATIONS

"Nike Air Huarache Run ID Shoe," [online] [Retrieved on Jan. 28, 2015]; Retrieved from the Internet URL: http://store.nike.com/us/en_us/product/air-huarache-run-id/?piid=39329& pbid=712882438, 6 pages.

"Style sheet (web development)," [online] [Retrieved on Jan. 28, 2015]; Retrieved from the Internet URL: http://en.wikipedia.org/wiki/Style_sheet_(web_development), 4 pages.

"T-shirt," [online] [Retrieved on Jan. 28, 2015]; Retrieved from the Internet URL: http://en.wikipedia.org/wiki/T-shirt, 7 pages.

"Upload your 3D Design," [online] [Retrieved on Jan. 28, 2015]; Retrieved from the Internet URL:http://www.shapeways.com/create?li=home-2ndPring-promo-create, 8 pages.

"3D printing," [online] [Retrieved on Jan. 28, 2015]; Retrieved from the Internet URL: http://en.wikipedia.org/wiki/3D_printing, 39 pages.

"3D Printer Software & Apps," [online] [Retrieved on Jan. 28, 2015]; Retrieved from the Internet URL: https://3dprinter.dremel.com/3d-printer-software-apps, 11 pages.

"How Shapeways 3D Printing Works," [online] [Retrieved on Jan. 28, 2015]; Retrieved from the Internet URL: http://www.shapeways.com/how-shapeways-works, 14 pages.

Moto X (1st generation), [online] [Retrieved on Jan. 28, 2015]; Retrieved from the Internet URL: http://en.wikipedia.org/wiki/Moto_X_(1st_generation), 10 pages.

*3-way extruder and colour blending nozzle Part 2—Build up and Printed things.* YouTube. Published Aug. 23, 2012. Retrieved on Sep. 10, 2014. Retrieved from the Internet: URL <http://www.youtube.com/watch?v=nkkbjpHVNZQ>, 2 pages.

*CubePro 3D Printer.* CubePro. Published Jan. 6, 2014. Retrieved on Sep. 10, 2014. Retrieved from the Internet: URL <http://cubify.com/en/CubePro?gclid=CJbWgJiz1cACFUiGfgod7zgA6A>, 7 pages.

Douglass, Carl. *Next Generation 3D Printer Extruders: The Rugged-HPX Line.* Kickstarter. Published Feb. 17, 2014. Retrieved on Sep. 10, 2014. Retrieved from the Internet: URL <https://www.kickstarter.com/projects/dglass3d/next-generation-3d-printer-extruders-the-rugged-hp>, 22 pages.

*MakerBot Replicator 2X.* MakerBot. Published Sep. 18, 2012. Retrieved on Sep. 10, 2014. Retrieved from the Internet: URL <http://store.makerbot.com/replicator2x>, 9 pages.

*Multicolor-extruder.* RepRap. Published Aug. 11, 2014. Retrieved on Sep. 10, 2014. Retrieved from the Internet: URL <http://reprap.org/wiki/Multicolor-extruder>, 3 pages.

*RepRap 3D printer 3-way extruder and colour blending nozzle Part 1—intro video.* YouTube. Published Aug. 23, 2012. Retrieved on Sep. 10, 2014. Retrieved from the Internet: URL <http://www.youtube.com/watch?v=_g0fiWx8RyM>, 3 pages.

*RUG/Pennsylvania/State College/Software/Parts/Dual Extruder.* PepRap. Published Aug. 6, 2014. Retrieved on Sep. 10, 2014. Retrieved from the Internet: URL <http://reprap.org/wiki/RUG/Pennsylvania/State_College/Software/Parts/Dual_Extruder>, 13 pages.

* cited by examiner

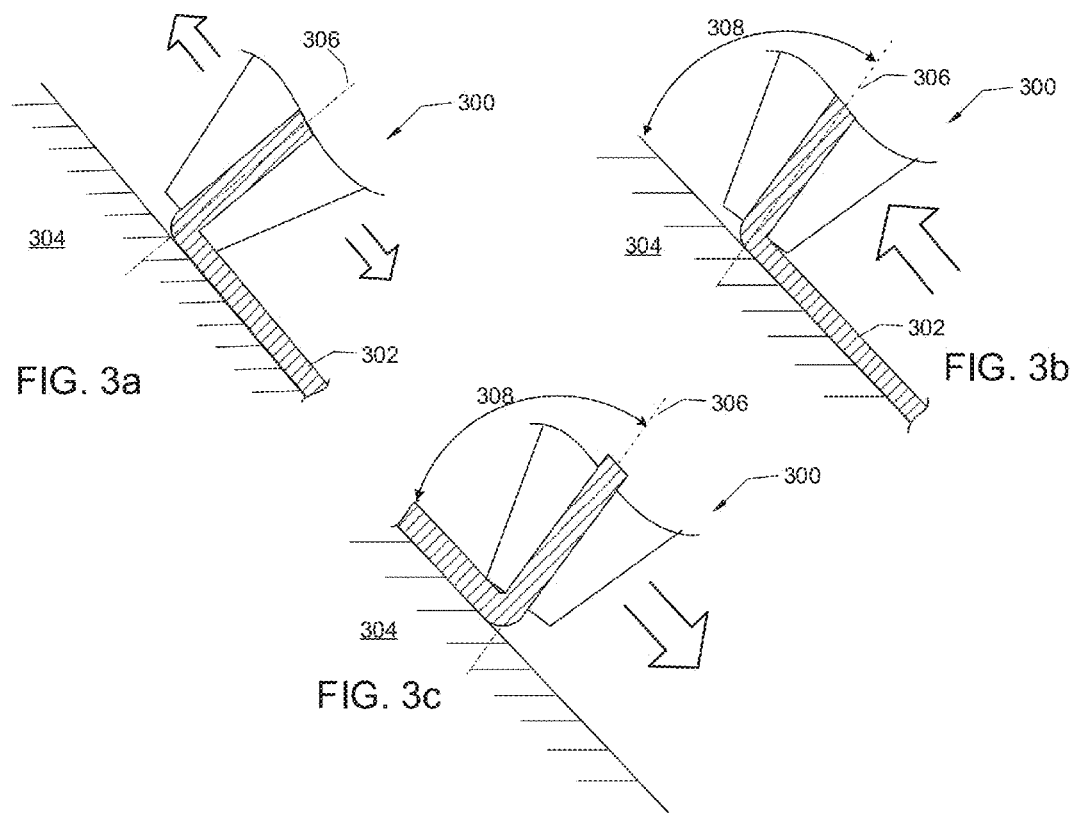

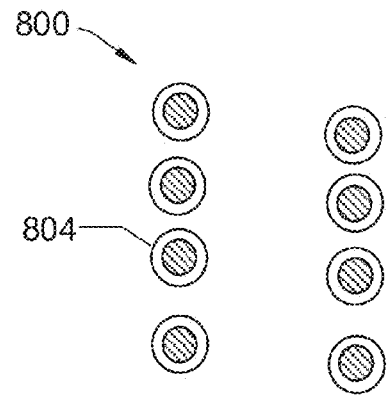
FIG. 8a  FIG. 8b
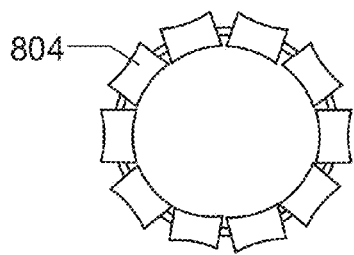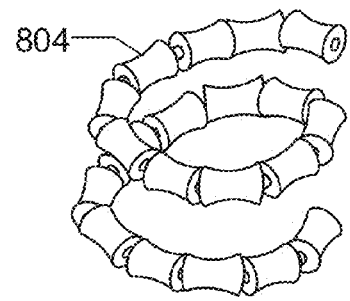
FIG. 8c  FIG. 8d

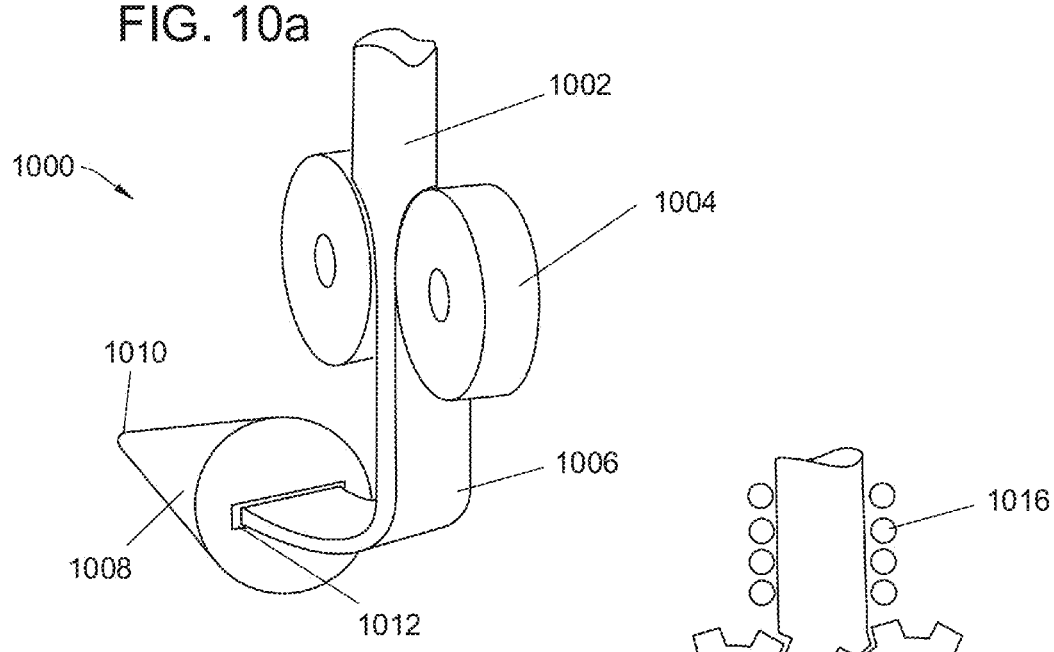
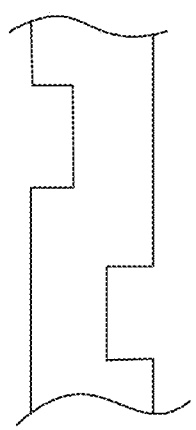
FIG. 10a
FIG. 10b
FIG. 10c

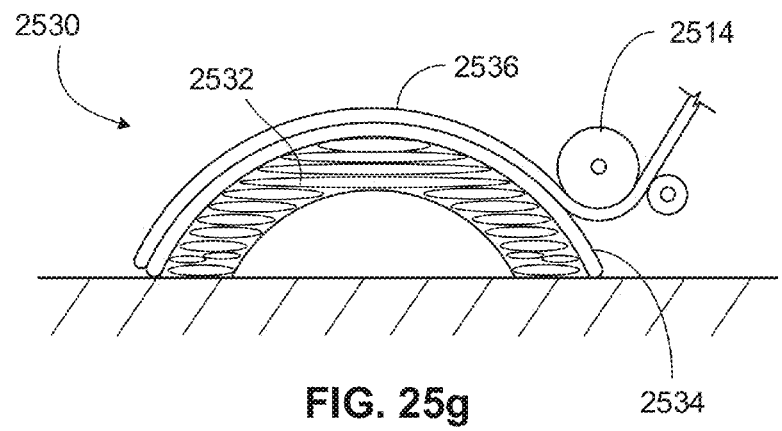
FIG. 25g
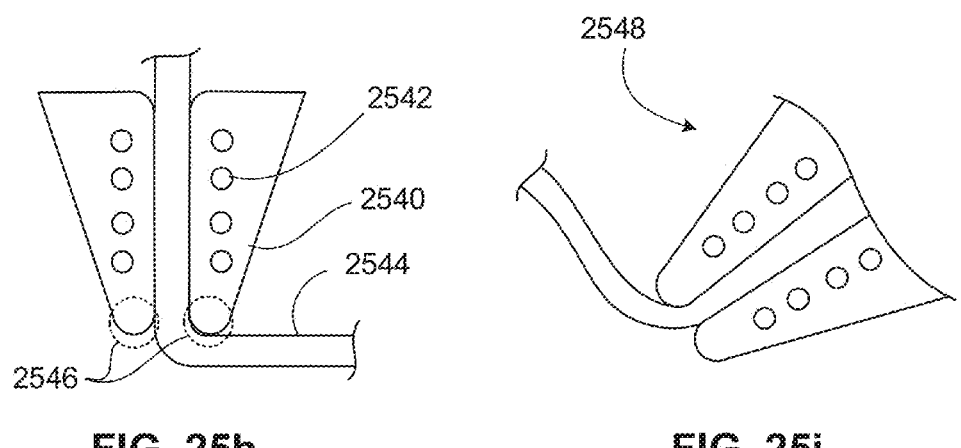
FIG. 25h
FIG. 25i

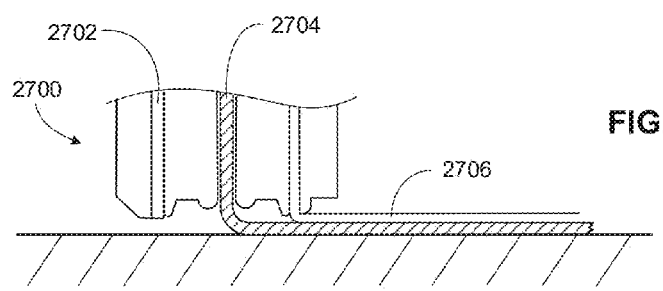
FIG. 27a
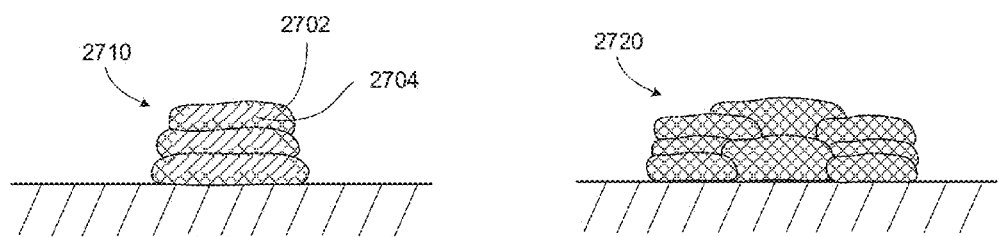
FIG. 27b                    FIG. 27c

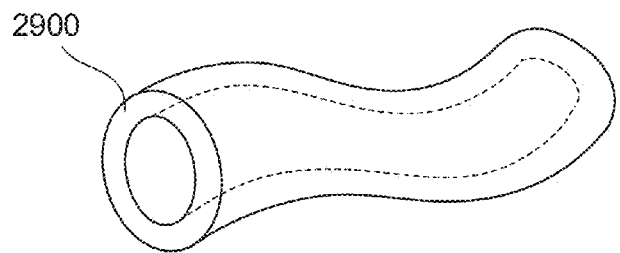
FIG. 29a
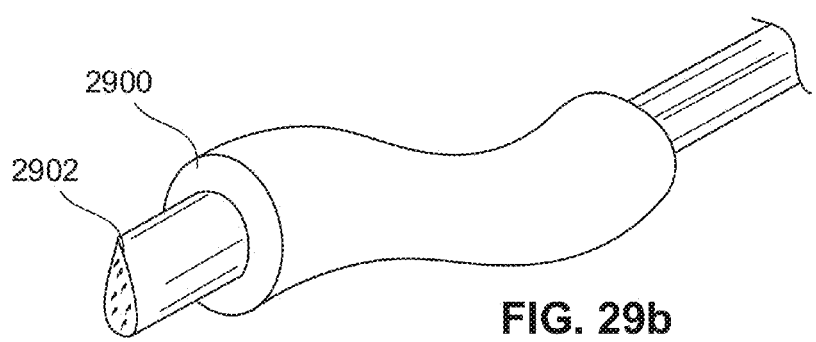
FIG. 29b
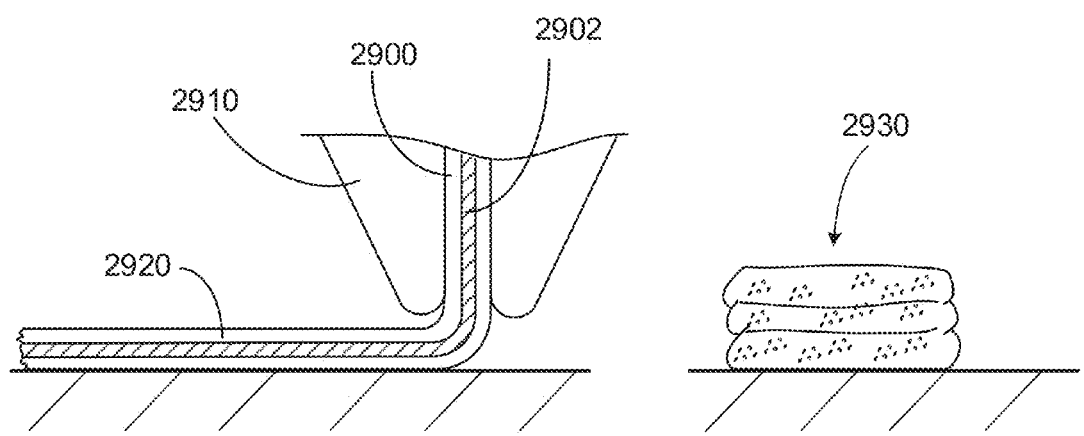
FIG. 29c
FIG. 29d

AUTOMATED SYSTEMS FOR COMPOSITE PART FABRICATION

CROSS-REFERENCE TO RELATED APPLICATION

This application claims the benefit under 35 U.S.C. §119 (e) of U.S. Patent Application No. 62/016,011, titled AUTOMATED SYSTEMS FOR COMPOSITE PART FABRICATION, filed Jun. 23, 2014, and this application is a continuation-in-part of U.S. patent application Ser. No. 14/745,285, titled MATERIAL DEPOSITION SYSTEMS WITH FOUR OR MORE AXES, filed Jun. 19, 2015, which claims the benefit of priority of U.S. Patent Application No. 62/014,453, titled MATERIAL DEPOSITION SYSTEMS WITH FOUR OR MORE AXES, filed Jun. 19, 2014. The disclosure of the above applications are incorporated herein by reference in their entirety.

BACKGROUND

This specification relates to three dimensional (3D) printing or additive manufacturing, such as fused deposition modeling (FDM).

FDM using extruded polymer filament has evolved rapidly and is useful for creating reasonably accurate three dimensional objects quickly. Current FDM printing is typically accomplished by forcing a solid plastic feedstock through a heated nozzle with smaller diameter than the original feedstock. The filament is liquefied before or as it passes through the constriction in the nozzle, and the feed pressure causes material to be extruded with a cross section approximately equal to the nozzle exit. Other 3D printing techniques referred to in this application include selective laser sintering (SLS), stereolithography (SLA), direct metal laser sintering (DMLS) and material jetting processes such as ObJet.

SUMMARY

This specification relates to 3D printing or additive manufacturing, such as FDM.

According to at least one aspect, a method includes: providing a matrix material and a fiber material separate from the matrix material to a fused deposition modelling (FDM) three dimensional (3D) printer; and delivering the matrix material and the fiber material to a printing location of the FDM 3D printer while maintaining separation of the fiber material from the matrix material up to the printing location of the FDM 3D printer, where the delivering includes melting the matrix material and embedding the fiber material within the matrix material. Implementations according to this aspect may include one or more of the following features.

The matrix material can include a first polymer, the fiber material can include a second polymer, and both the first polymer and the second polymer can be formed from a same monomer, but the first polymer can have a lower melting temperature than the second polymer. The providing can include feeding the first polymer and the second polymer together, the first polymer forming a hollow tube that surrounds but is separate from the second polymer, and the delivering can include feeding the first and second polymers through a heated nozzle at a temperature that melts the first polymer but not the second polymer, the first polymer having a lower glass transition temperature than a glass transition temperature of the second polymer.

The delivering can include: delivering the matrix material with a first tool including a heated nozzle; and delivering the fiber material with a second tool, separate from the first tool. The second tool can include a spool and a heated roller, and delivering the fiber material can include: re-melting previously delivered matrix material using the heated roller, and pressing the fiber material into the re-melted matrix material using the heated roller.

The delivering can include delivering the matrix material and the fiber material with a single tool. The single tool can include a heated nozzle and a roller on a swivel system, and the delivering can include: delivering the matrix material with the heated nozzle; and delivering the fiber with the roller on the swivel system. Moreover, the delivering can include: delivering a first layer of the matrix material; delivering a layer of the fiber material over the first layer of the matrix material; delivering a second layer of the matrix material over the layer of fiber material; and compacting and bonding the first and second layers of matrix material and the layer of fiber material together using an iron tool.

The delivering can include depositing one or more first material segments with at least one first locking portion and one or more second material segments with at least one second locking portion with the at least one second locking portion having a shape that is defined by a shape of the at least one first locking portion, whereby the at least one second locking portion forms an interlock with the at least one first locking portion, and where the first and second material segments each include a continuous material, and the interlocked first and second material segments form an object having comparable resistance to delamination or breakage in all directions. The one or more first material segments can form a first layer, the one or more second material segments can form a second layer, and each of the first and second layers can be non-planar.

In addition, each of the first and second layers can be formed from the matrix material including a first polymer and the fiber material including a second polymer, and both the first polymer and the second polymer can be formed from a same monomer, but the first polymer can have a lower melting temperature than the second polymer.

According to at least one aspect, a system for fabricating an object, the system including: a build platform; and two or more tools associated with the build platform; where the two or more tools are configured and arranged with respect to the build platform to add matrix material and fiber material in non-planar layers to build the object. Implementations according to this aspect may include one or more of the following features.

The two or more tools can include a fused deposition modelling extruder nozzle, a fiber dispenser, and an iron. The two or more tools can include a tool for delivering layers of build material to a build station including the build platform, and a compaction tool that adds separately fabricated layers of build material to the object to form a unified component. Further, the system can include one or more layer fabrication stations, where the two or more tools include a fiber dispenser associated with at least one of the one or more layer fabrication stations.

The compaction tool can include an iron associated with the build station. The two or more tools can include a fused deposition modelling extruder nozzle associated with the build station. The two or more tools can include a trim tool associated with the build station. The two or more tools can include both a fused deposition modelling extruder nozzle and a trim tool associated with the build station. Moreover, the two or more tools can include a tool for inserting additional layers vertically into slots created in layers of the object being fabricated.

The details of one or more implementations of the subject matter described in this specification are set forth in the accompanying drawings and the description below. Other features, aspects, and advantages of the invention will become apparent from the description, the drawings, and the claims.

BRIEF DESCRIPTION OF THE DRAWINGS

FIGS. 3a-3f show an example variable angle nozzle depositing material on a sloped surface according to an implementation of this disclosure.

FIGS. 8a-8d show various views of an example material guide system.

FIGS. 10a-10c show example implementations of a roller-based feeding system.

FIG. 25g shows a simplified version of a system similar to that of FIG. 25b creating a more complex shaped part.

FIG. 25h shows another version of a fiber deposition system, which includes a nozzle with heating elements.

FIG. 25i shows the fiber deposition nozzle of FIG. 25h as being moved by a 4 or 5 axis motion system while depositing fibers.

FIG. 27a shows a cross section of a material deposition system including orifices for dispensing fiber material and matrix materials such as thermoplastic or thermoset materials.

FIGS. 27b and 27c show cross section views of different possible resulting material configurations that can be created by depositing fiber and matrix material with the system of FIG. 27a.

FIG. 29a shows a hollow tube of matrix material.

FIG. 29b shows a fiber bundle running through the center of the matrix material tube of FIG. 29a.

FIG. 29c shows a deposition system feeding the matrix material tube plus the fiber bundle of FIG. 29b through a nozzle, depositing them together such that the matrix material and fiber bundle fuse to become a composite material as they exit the nozzle.

FIG. 29d shows a cross section of a composite material structure that can be created using the system of FIG. 29c.

Like reference numbers and designations in the various drawings indicate like elements.

DETAILED DESCRIPTION

Figure 1:
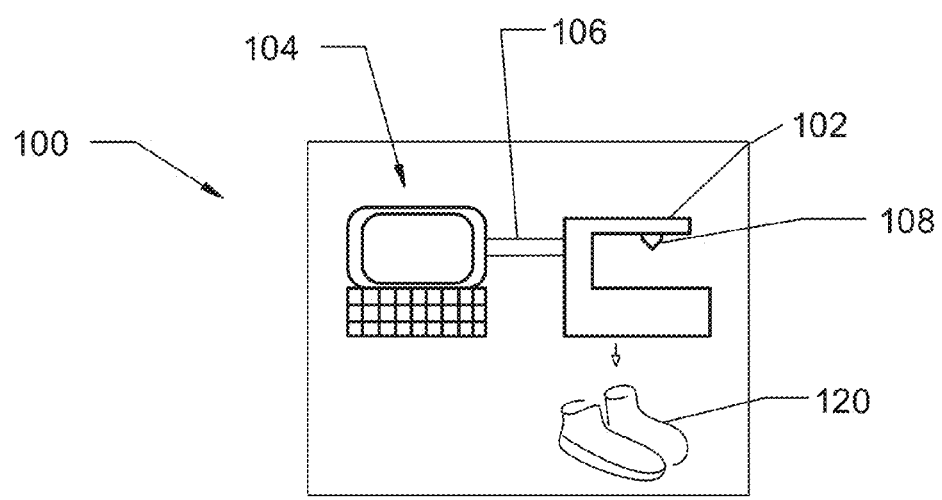
FIG. 1 shows an example FDM 3D printing system.

Referring to FIG. 1, an example FDM 3D printing system 100 includes an extruder or 3D printer 102, a controller 104, and a communication link 106 that links the extruder 102 to the controller 104. The 3D printer 102 includes an extruder nozzle 108. The FDM system 100 can produce 3D products such as item 120. The controller 104 can include one or more processors, memory, hard drive, solid-state drive, and/or input devices such as touch screen, mouse, or voice input capability. In some cases, the controller 104 can be an internet server or some other device, computer, processor, phone, or tablet. In some cases, the controller 104 and extruder 102 are integrated into a single 3D printing device.

Figure 2A:
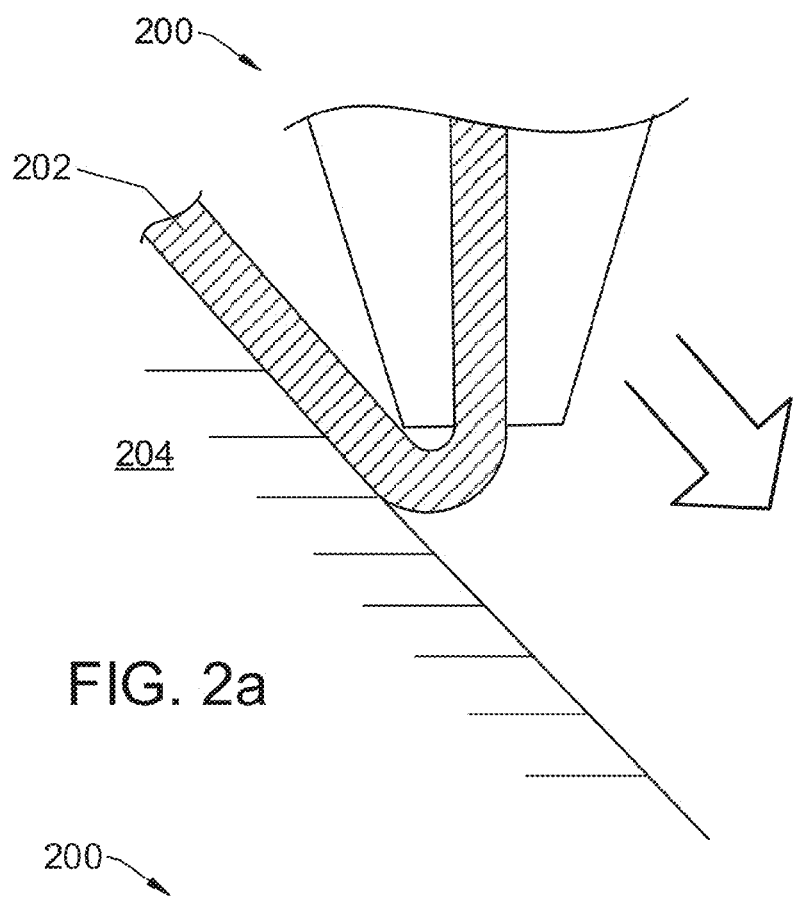
FIGS. 2a and 2b show a fixed angle nozzle depositing material on a sloped surface.

Referring now to FIG. 2a, a nozzle 200, for example from an FDM system such as system 100, is shown depositing material 202 on a sloped part surface 204 with a motion of travel in a downward sloping direction along part surface 204. The nozzle 200 can be a nozzle tip designed for use with an FDM system or it can be from a different material deposition system such as a welding tip or electrode, syringe, adhesive material deposition system, material solidification system, material curing system or material pump, or combinations thereof. As shown the nozzle 200 is constrained to maintain its vertically oriented position. In other words, the nozzle 200 can move along, for example, the x, y, and z coordinates during deposition but will not be able to further change the angle at which it deposits material. Accordingly, the system depicted in FIG. 2a may be referred to as a 3-axis FDM system. Implementations of the 3-axis FDM system are further described in related U.S. patent application Ser. No. 14/663,393, filed Mar. 19, 2015, titled SYSTEMS AND METHODS FOR IMPROVED 3D PRINTING, hereby incorporated by reference in its entirety.

Figure 2B:
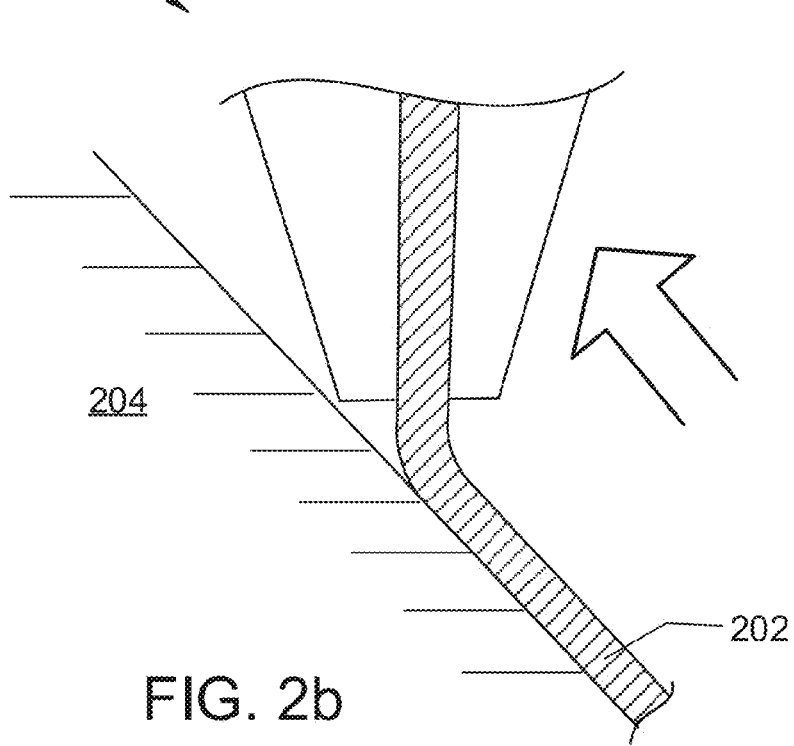

FIG. 2b shows the nozzle 200, likewise constrained to the vertical orientation, depositing material 202 on the sloped part surface 204 with a motion of travel in an upward direction along the part surface 204. Here, the nozzle 200 is shown moving uphill relative to the part surface 204 instead of downhill as in FIG. 2a. The nozzle 200 can be a nozzle designed for use with an FDM system or it can be from a material deposition system such as a welding tip or electrode, syringe, adhesive material deposition system, material solidification system, material curing system or material pump or combinations thereof.

As shown in FIGS. 2a and 2b, the distance between the nozzle 200 and the part surface 204 can be varied depending on whether the nozzle 200 is moving downward or upward to thereby ensure that the resulting deposited material thickness can be similar or the same when the nozzle travels downhill or uphill or horizontally.

For example, in one method of correcting the position or path of the nozzle 200, corrections can be made in the following way: a first nominal path or set of positions for the nozzle 200 is computed independent of the direction of travel of the nozzle 200 or the slope of the path of the nozzle 200. Then a second path can be created by adjusting vertical position values by an amount dependent on the slope of the path of the nozzle 200. The slope of the path may be defined as vertical distance moved over an interval divided by horizontal distance moved over the same interval, or as rate of instantaneous vertical motion divided by rate of instantaneous horizontal motion.

FIGS. 3a, 3b, and 3c show material deposition on a sloped surface by an FDM system with a nozzle that is not constrained to be vertical. This can be for example an FDM system with additional axes to allow rotation of the nozzle, which is discussed in further detail below.

Referring to FIG. 3a, a nozzle 300 is shown depositing material 302 along a surface with the nozzle axis perpendicular to a local surface 304. In this case, the nozzle 300 can deposit the material 302 to have the same thickness while traveling in either direction along a given path. That is, the path can be the same for a nozzle moving in either direction to deposit material of a desired thickness.

Referring to FIG. 3b, the nozzle 300 is shown depositing the material 302 along a sloped surface in an orientation such that the nozzle axis is not perpendicular to the local surface 304. The nozzle 300 shown in FIG. 3b can have one or more movable angle motion degrees of freedom or actuation so that the angle of a nozzle axis 306 with respect to vertical can be changed or can change along a path. The nozzle 300 in FIG. 3b can have an acute angle 308 between its axis and the surface on one side (the "acute angle side"). The nozzle 300 in FIG. 3b is shown traveling toward the side that forms the acute angle side as it deposits material that is left behind on the local surface 304.

Referring to FIG. 3c, the nozzle 300 is shown in a similar configuration as in FIG. 3b, that is, in the same orientation as in FIG. 3b while depositing material along the same sloped surface, but is instead shown moving away from the side that forms the acute angle. In order to deposit material of a given desired thickness, the nozzle 300 must follow a different path while moving toward the acute angle side as in FIG. 3b as compared to moving away from the acute angle side as in FIG. 3c. The path that the nozzle 300 follows can be closer to the surface 304 when the nozzle moves toward the acute angle as in FIG. 3b and the path can be farther away from the surface 304 when the nozzle 300 moves away from the acute angle as in FIG. 3c in order to deposit material of the same thickness in both cases.

Generally, a nominal path may be a path that a nozzle with axis perpendicular to the local surface should follow to deposit material of a given thickness in either direction. A nominal path may be adjusted to accommodate a non-perpendicular angle between the nozzle and the local surface while still depositing material of the same thickness by adjusting the path away from the local surface in areas where the nozzle moves away from the acute angle between the nozzle axis and the surface and adjusting the path to be closer to the surface in areas where the nozzle moves toward the acute angle.

Figure 3D:
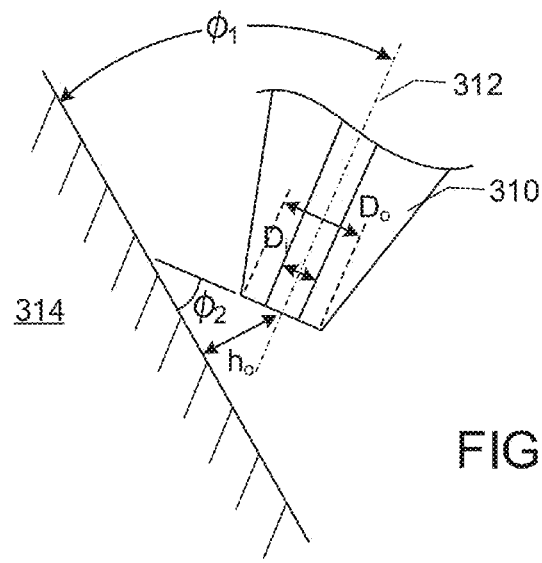

Referring now to FIG. 3d, a nozzle 310 with an orientation angle $\Phi_1$ between a nozzle axis 312 and a part surface 314. The angle between the surface 314 and a plane perpendicular to the nozzle axis can be defined as angle $\Phi_2$. $\Phi_2$ can therefore represent the angle of the nozzle tip to the part surface at a specific location. As shown, the nozzle has a tip outer diameter $D_o$ and a tip inner diameter $D_i$. Nozzle tip inner diameter $D_i$ can represent a nozzle exit orifice. A nominal path for the nozzle to follow can be represented by a series of position points, such that at each point along the nominal path there can be a distance, $h_o$, between the local surface and the center of the nozzle exit orifice, where $h_o$ can be measured perpendicular to the local surface.

Figures 3E, 3F:
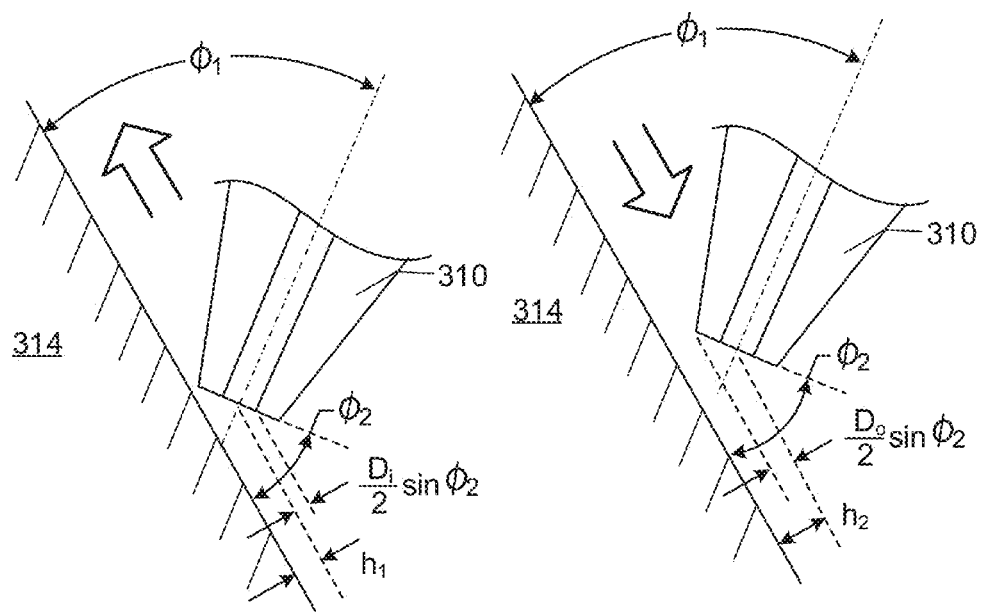

FIG. 3e shows the nozzle 310 of FIG. 3d traveling toward the side that forms the acute angle $\Phi_1$. The angle $\Phi_2$ is similarly shown as in FIG. 3d. In order for the nozzle 310 with angle $\Phi_1$ to deposit material having the same thickness as a nozzle that is perpendicular to the local surface (for example, see FIG. 3a), an adjustment can be made to the path of travel such that a new distance between the surface and the center of the nozzle exit orifice, $h_1$, is less than $h_o$. One example way to accomplish this adjustment can be by making the following calculation: adjustment$_1$=(D$_i$/2)*sin($\Phi_2$). The new path point can be found as: $h_1=h_o-$adjustment$_1$. Corresponding x,y,z coordinates or other suitable coordinates can be calculated with knowledge of $\Phi_2$, $h_o$, and $h_1$. The path in this case can be closer to the surface than the nominal path because the inside edge of the nozzle orifice largely determines the resulting material thickness.

FIG. 3f shows the nozzle 310 of FIG. 3d traveling in a direction away from acute angle $\Phi_1$. Again, $\Phi_2$ is defined the same as in in FIG. 3d. In order for the nozzle 310 with angle $\Phi_1$ to deposit material in the same thickness as a nozzle that is perpendicular to the local surface (not shown here, but see FIG. 3a), an adjustment can be made to the path of travel such that a new distance between the surface and the center of the nozzle exit orifice, $h_2$, is greater than $h_o$. One example way to accomplish this adjustment can be by making the following calculation: adjustment$_2$=(D$_o$/2)*sin($\Phi_2$). The new path point can be found as: $h_1=h_o+$adjustment$_2$. Corresponding x,y,z coordinates or other suitable coordinates can be calculated with knowledge of $\Phi_2$, $h_o$, and $h_2$. The path in this case can be farther from the surface than the nominal path because the outside edge of the nozzle tip largely determines the resulting material thickness.

Other calculations can be used to make corresponding adjustments based on $\Phi_2$, $h_o$, and $h_1$. In some cases, one or more of nozzle geometry, type of material being deposited, surface properties, etc. can be used to determine the necessary adjustments.

Figure 4:
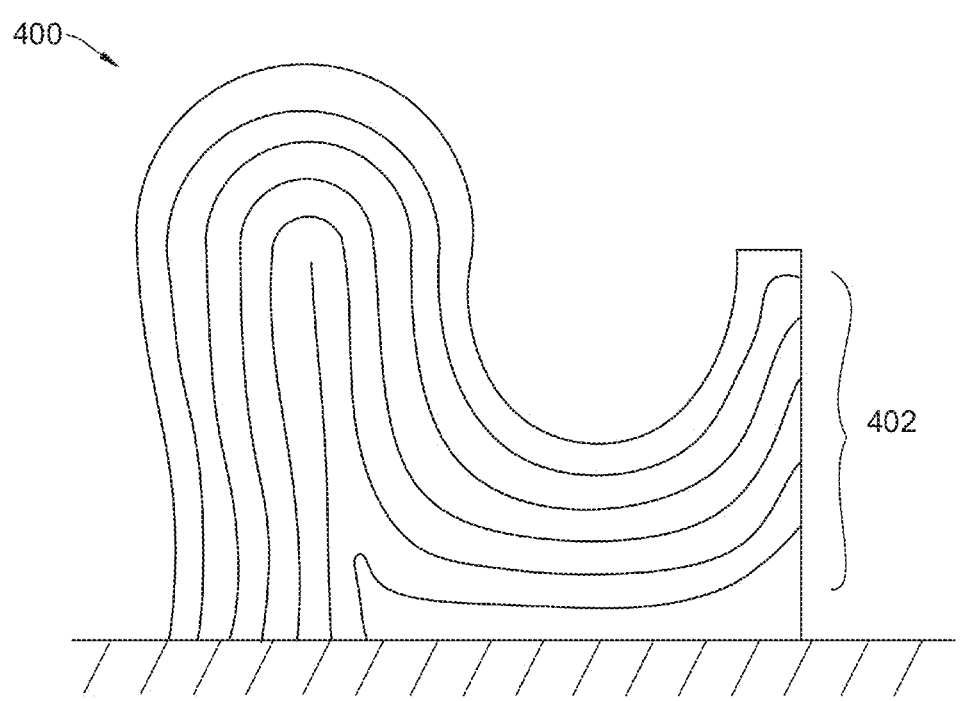
FIG. 4 shows a cross section view of a sample part made using a 5-axis FDM system.

Referring now to FIG. 4, a cross-section of an example part 400 is shown. The part 400 may be made by using a 5-axis FDM system or other material deposition system with a nozzle that can change angular orientation relative to the part. Part 400 is made of multiple layers 402 of deposited material that may be non-planar. In some cases, such layers 402 of deposited material may have a tendency to split or delaminate at layer interfaces.

Figure 5:
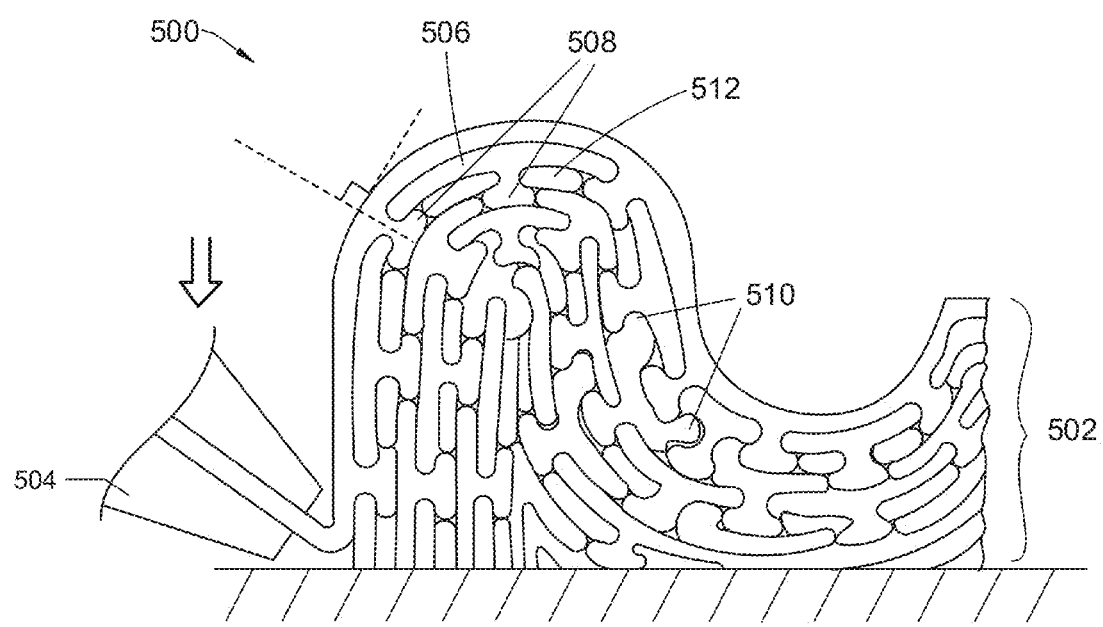
FIG. 5 shows a cross section of a sample part with interlocking layers made using a 5-axis FDM system.

FIG. 5 shows a cross section of a part 500 that is similar to the part 400 of FIG. 4, except that layers 502 shown in FIG. 5 are locked together so that they are prevented or mitigated from splitting or delaminating at layer interfaces. Layers 502 can be made up of structural members 506 which are deposited as material from a nozzle 504 that then solidifies. Structural members 506 can be formed in several types with different features which combine to create an interlocking effect.

For example, layers can be deposited starting with the innermost layers and proceeding to the outermost layers. An $n^{th}$ layer can be deposited with one or more gaps of a first width. Then, a next layer (n+1 layer) can be deposited with gaps of a second width which can be narrower than the first width and which can be aligned with the gap(s) of the $n^{th}$ layer. A subsequent layer (n+2 layer) can be deposited over or outside of the n+1 layer with sufficient material and deposition speed or pressure that the material of the n+2 layer flows through the gap in then n+1 layer and into the gap in the $n^{th}$ layer. The n+2 layer material can partially or completely fill the gap(s) in the $n^{th}$ and n+1 layers. If the gap(s) in the $n^{th}$ layer are larger than the gap(s) in the n+1 layer, the N+2 layer material can form a physical interlock with the material of the other layers. The n+2 layer material that flows into the gaps in the other layers can be a locking feature 508. Each layer can alternately have gaps of different widths at different locations as well as locking features so that all or nearly all of the layers can be sequentially interlocked. This construction can be effective at eliminating layer separation or delamination. The part 500, formed in this or other similar manner, can include one or more of flat, concave, and convex portions.

In some cases, it can be possible to create useful layer interlocking with different layers having gaps of the same width or with combinations of just single gap-layers plus layers with locking features (i.e., without the stacking of multiple layers with aligned gaps). The layers 502 and associated gaps as well as locking features can be formed with the nozzle 504 being in various orientations. In some cases, the nozzle (and its corresponding nozzle axis) can remain vertical during material deposition, as in the case of a conventional 3-axis (x,y,z) FDM system. In some cases, the nozzle can be kept perpendicular to the local part surface during the deposition process. In some cases, the nozzle can have a variable angle with respect to the local part surface in order to facilitate certain features such as forming the base of a vertical wall next to a baseplate. For example, FIG. 5 shows the nozzle 504 completing a section of vertical wall next to a baseplate and shows the nozzle 504 at a non-perpendicular angle to the part surface to avoid crashing into the baseplate or other portions of the FDM system. Additionally, or alternatively, the angular orientation of the nozzle may be changed from a perpendicular angle to a non-perpendicular angle, or in some cases from a first non-perpendicular angle to a second non-perpendicular angle different from the first, to avoid making contact with an already deposited portion of the object being fabricated. In some cases, by changing the angular orientation of the nozzle to avoid making contact with parts of the FDM system or the object being fabricated, the possible coverage area of the nozzle may be increased. In other words, the nozzle, by changing its angular orientation to avoid making contact, could deposit materials into tighter spaces than would be otherwise possible without making such angle re-adjustments. Referring to FIG. 5, as an example, the nozzle 504 can, by rotating in a clockwise direction to avoid hitting the base, deposit material closer to the intersection between the object and the base.

Locking features can be formed with the nozzle perpendicular to the local part surface or with the nozzle angled off of perpendicular to the local part surface. Layers and structural members can also be formed with overhangs 510 adjacent to locking features of other layers in order to create an interlocking structure. In some cases, interference members 512 can be deposited to help further improve interlocking between layers.

For a 5-axis FDM system or other material deposition system with a nozzle that can change angular orientation relative to the part, a compact, angularly variable distal end can help the nozzle reach into tight spaces. To achieve this, it is generally desired to have one of the angular articulation axes as close to the "tip"—or point where material is dispensed—as possible. However, based on conventional feedstock dispensing systems, it can be challenging to get a solid feedstock filament to go around such a sharp bend at the end before being pushed out of the tip.

Figure 6A:
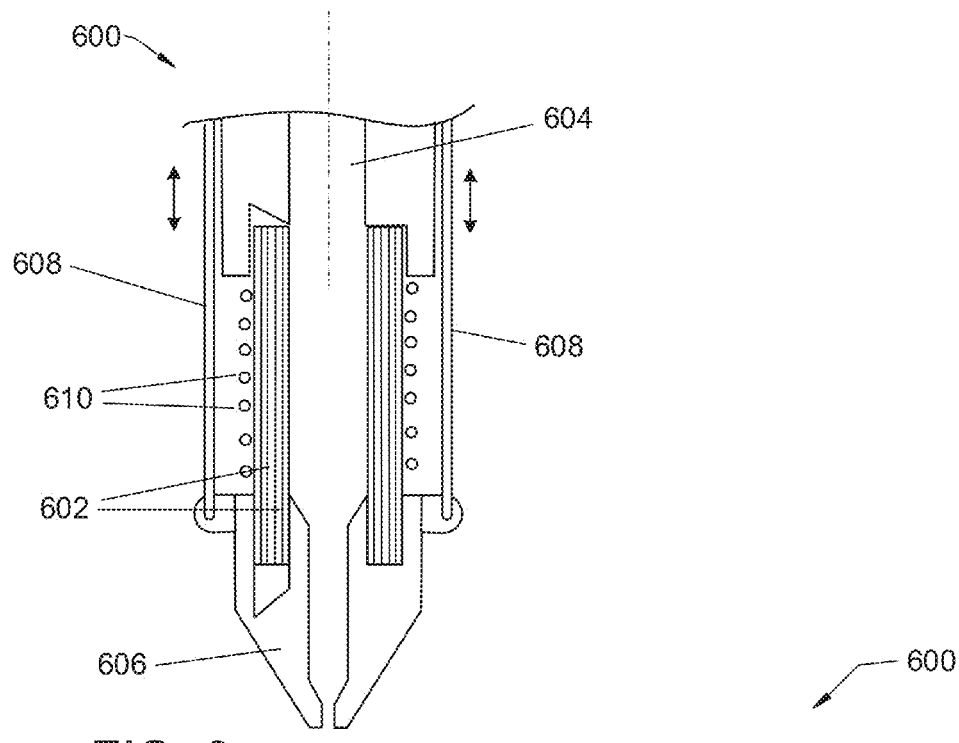
FIGS. 6a-6b show side cross section views of an example implementation of an articulating material dispensing system.
Figure 6B:
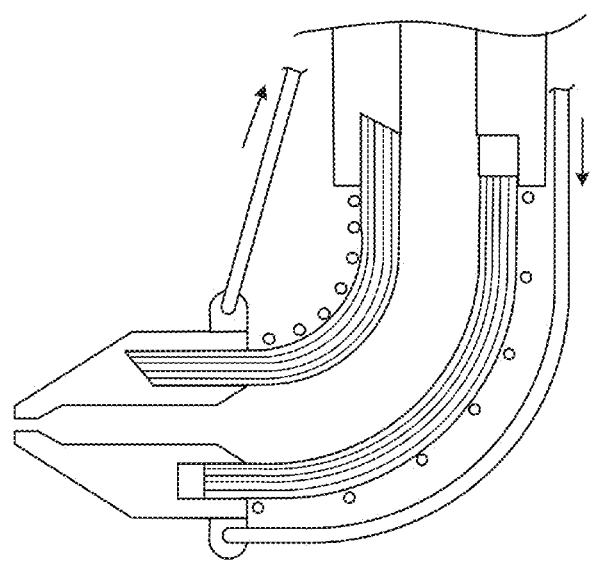

Referring to FIGS. 6a and 6b, an articulating material dispensing system 600 is shown, with FIG. 6a showing the articulating material dispensing system 600 in a nominal (vertical) configuration and FIG. 6b showing the articulating material dispensing system 600 in an articulated (flexed) configuration.

As shown, the material dispensing system 600 can include flexible strips 602 which form the sides of a material channel 604. There can be multiple flexible strips 602 in a leaf-spring structure that enables the width of the material channel 604 to be maintained throughout the range of articulation. A nozzle 606 can be employed at the distal end of the material dispensing system 600 to create a specific exit orifice size and control the flow of material. Cables 608, as well as pushrods or other types of actuators, can be used to pull and/or push on the material dispensing system to cause controllable articulation. In some cases, a flexible sleeve can be used to hold the flexible strips 602 in place. Heating elements 610 can be used to heat the material flowing through the flexible portion of the system or can be used to heat the nozzle itself. Heating material flowing through the flexible portion of the system can help liquefy or soften the material which may allow the material to more easily flow around a corner when the system 600 is articulated. The flexible strips 602 can be used to shift in the nozzle axial direction (or along the length of the curve) to enable articulation (see FIG. 6b). Because creating the curvature, as indicated by the changing lengths of the flexible strips 602, may require more feedstock material to ensure a continuous flow of material, the volume flow of material per distance, or extrusion ratio, may need to be increased in cases where there are curvatures in the feedstock channel.

In some cases, a material drive system such as a drive wheel can be located proximal to the articulating section. Alternatively, or additionally, a material drive system such as the drive wheel can be located distal to the articulating section. In cases where the feedstock material is softened or liquefied for improved passage through the articulating section, the feedstock material can be cooled, for example via a cooling zone, prior to being driven by the driven wheel.

The position of the exit orifice with respect to the degree of articulation or direction of articulation may be characterized so that for a given articulation amount (i.e. amount of bending) the position of the nozzle exit orifice can be known with little error.

Figure 7A:
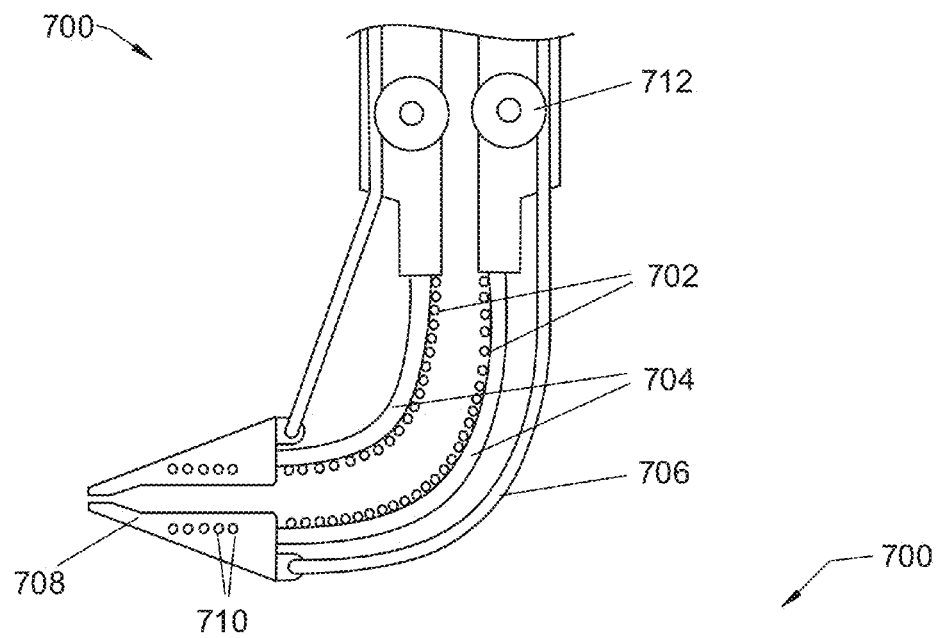
FIGS. 7a-7b show side cross section and isometric views of another example implementation of an articulating material dispensing system.
Figure 7B:
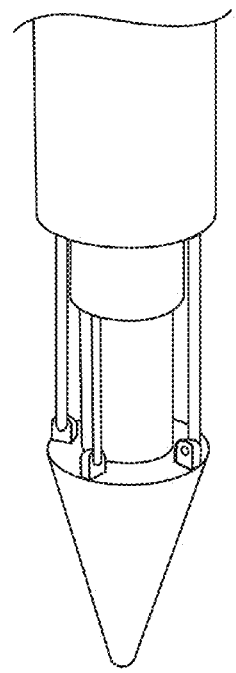

Referring to FIGS. 7a and 7b, an articulating material dispensing system 700, an alternative implementation, is shown. The system 700 shown in FIGS. 7a and 7b is similar to that of FIGS. 6a and 6b except that the material dispensing channel can be lined with or defined by a coil spring or set of material rings 702 in the articulating portion of the system. A coil spring can be used to define the material dispensing channel and can enable the channel size to stay relatively constant during articulation. A flexible sleeve 704 can surround the coil spring and further guide it or constrain its shape. Cables 706, as well as pushrods, linkages, hydraulic actuators, inflatable bladders, muscle wires, or the like, can be used to control the degree of articulation of the system 700.

In the example shown in FIG. 7b, the system 700 is shown with 4 cables for articulation (one is hidden behind other components). This way, the system 700 can be articulated in multiple directions (i.e. can have multiple degrees of freedom). When combined with a 3-axis gantry system, a net system with 5 (five) axes of motion can be created (in addition to motion of the dispensed material). Additional translation and rotation axes are also possible to create 6, 7, 8, or more axes of motion and to allow the fabrication of a wide range of part shapes.

A nozzle 708 is shown at the distal end of the system 700 to control material flow and create an exit orifice. Heating elements 710 are shown in the nozzle 708, but they can also or alternately be in the articulating section or proximal to (i.e. above) the articulating section. FIG. 7a also shows drive wheels 712 (or a drive wheel and an idler wheel) that are shown proximal to the articulating section, though they can also be located at the articulating section or distal to it, for example in the nozzle 708.

Referring to FIGS. 8a-8d, a material guide system 800 can be used in an articulating material dispensing system such as that of FIGS. 7a and 7b to help guide the feedstock material. FIG. 8a shows a cross section of a plain coil spring 802. FIG. 8b shows a cross section of the same coil spring 802 with the addition of contoured rollers 804 which can be threaded onto the spring and which can individually rotate about the spring such that material passing axially through the center of the spring might contact the rollers and might experience low resistance to axial motion due to the ability of the rollers to rotate.

FIG. 8c shows a top view of the material guide system 800 of FIG. 8b, and FIG. 8d shows an isometric view of the same. The material guide system 800 as shown in FIGS. 8a-8d can allow a material dispensing system to articulate (bend) while adding minimum resistance to feed motion of the material.

Figure 9:
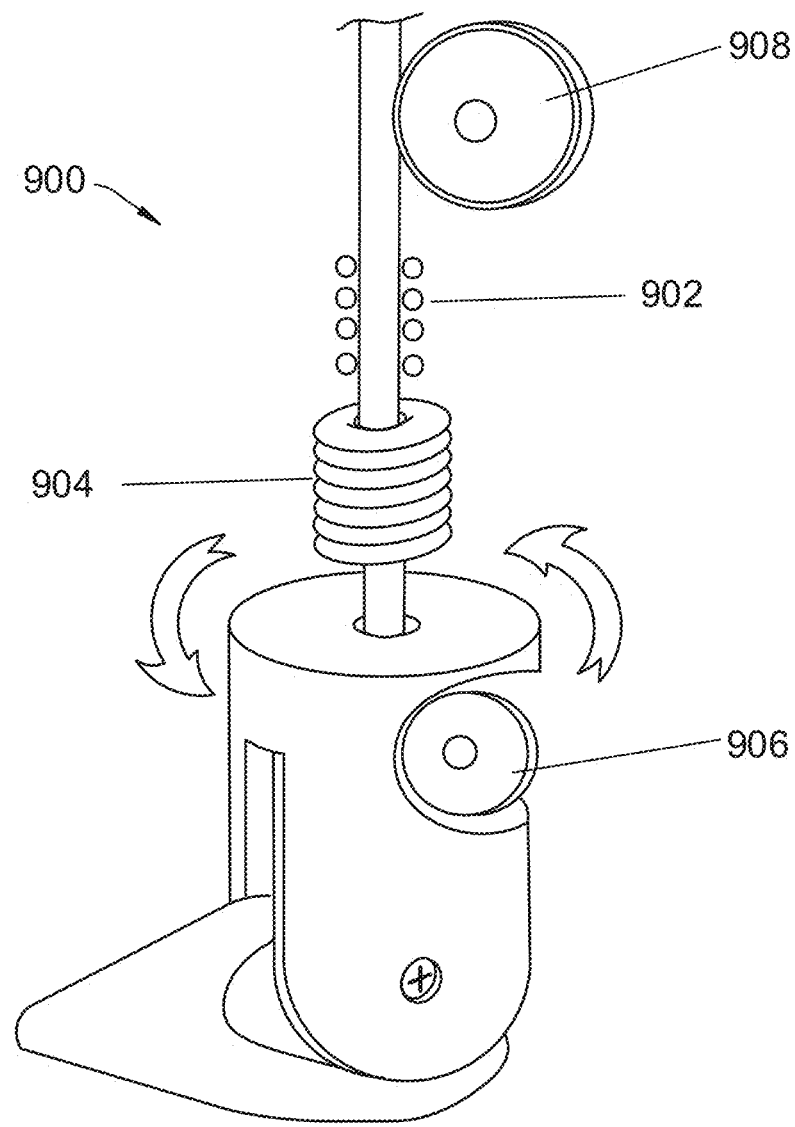
FIG. 9 shows an isometric view of another example implementation of an articulating material dispensing system.

Referring to FIG. 9, a material dispensing system 900 having two rotational degrees of freedom is shown. As shown, the first rotational degree of freedom allows the system to rotate about an axis that can be aligned with the entering feedstock—i.e. a vertical axis in the orientation of the system shown in FIG. 9. The second rotational degree of freedom allows a nozzle to rotate about an axis that can be perpendicular to the axis of the first rotational degree of freedom. Continuous rotation of the first rotational degree of freedom can be possible if "winding up" of the feedstock can be eliminated. One or both of the heating zone and a cooling zone can be included. The heating zone 902 can help soften the feedstock to the point that it alleviates wind-up of the material (i.e. it allows arbitrary angular dislocation of the distal portion of the feedstock relative to the proximal portion). As material is continually fed through, any adverse effects of the local twisting of the material can be alleviated as that material is passed out of the nozzle and fresh feedstock material arrives to be heated so it can take up any further twisting of the system. A cooling zone 904 can help enable the material to solidify again before it is fed into the nozzle. A final drive wheel 906 can be used to provide the necessary driving force to controllably feed the feedstock into the nozzle. The material can be re-heated and softened or liquefied in the nozzle. An initial drive wheel 908 can be included to help drive the feedstock into the heating zone 902.

In some cases, the feedstock material can be pinched and/or formed into flattened and/or ridged sections to help facilitate going around corners. For example, referring now to FIGS. 10a-10c, a material deposition system 1000 changes the cross section shape of the feedstock so that the feedstock can more easily turn a tight corner.

FIG. 10a shows a cylindrical feedstock 1002 being fed through rollers 1004 which can squeeze it and transform the fed-through portion to a ribbon section 1006 to have a thin rectangle or other cross-sectional shape with one thin dimension so that the feedstock can bend around a corner more easily or with lower force. A nozzle 1008 can provide an exit orifice 1010. The nozzle 1008 can have an opening 1012 shaped correspondingly to accept the reshaped feedstock, for example it can have a rectangular opening. The shape of the exit orifice 1010 can be any required shape, for example it can have a circular shape. The feedstock can be heated before entering the feed rollers so that it is softened and its cross section shape can be more easily changed. The feedstock can be cooled as it passes between the rollers or it can be cooled after it passes through the rollers so that it solidifies and its shape is stable before it enters the nozzle. Additional elements of the material dispensing system 1000, for example guides, can further be provided to improve operation.

FIG. 10*b* shows rollers 1014, which is another version of the forming rollers 1004 of FIG. 10*a*, that has roller shapes that create a resulting material shape that has positive drive features. For example, the resulting reshaped feedstock can have a constant cross section area along its length so that a constant motion of the feedstock should result in a constant material flow rate out of a nozzle. A heating zone 1016 can be positioned at an upstream position relative to the rollers 1014 to soften the feedstock material for improved formability. FIG. 10*c* shows another possible reshaped feedstock shape with positive drive features.

Figure 11A:
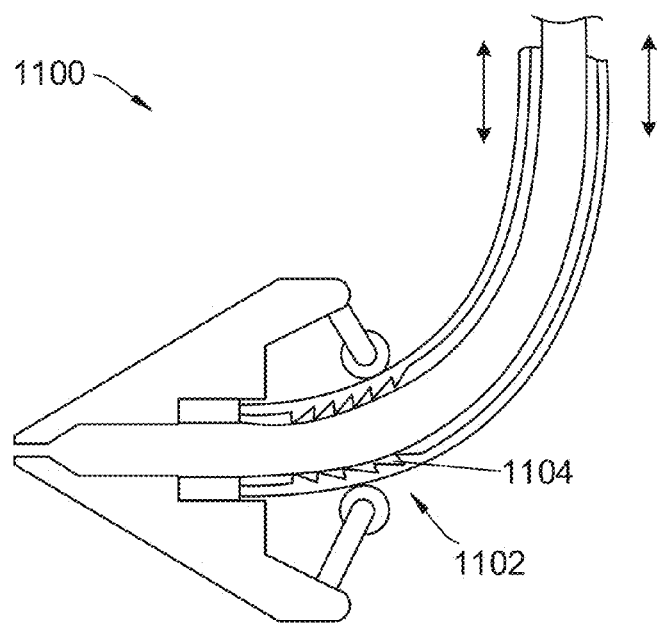
FIGS. 11a-11b show an example implementation of an articulating material dispensing system having drive dogs.
Figure 11B:
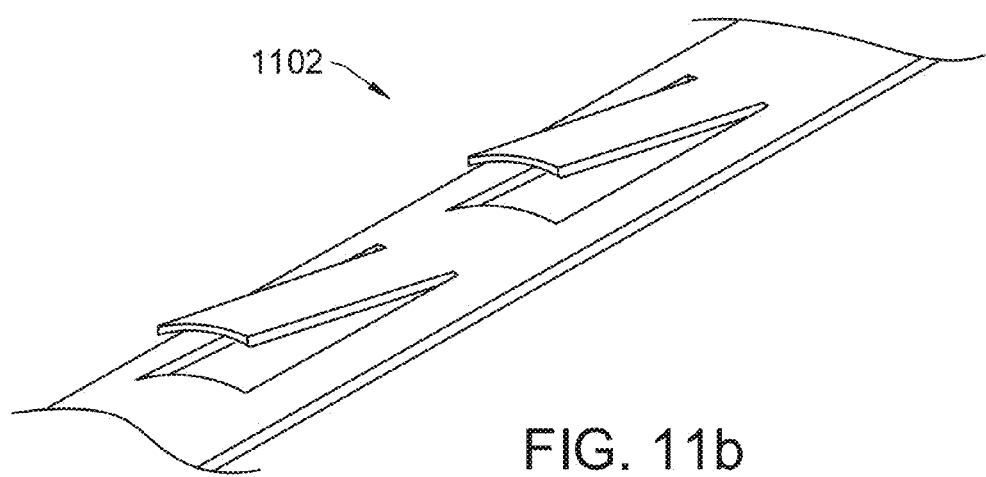

In some cases, additional features, such as reciprocating linear feed dogs, can be used to help drive the feedstock. FIGS. 11*a* and 11*b* show aspects of an articulating material dispensing system 1100 that is based on the reciprocating linear feed dog mechanism.

Referring to FIG. 11*a*, the articulating material dispensing system 1100 has a bendable portion that creates articulation. The system includes reciprocating drive dogs 1102 which can be flexible members with asymmetric teeth that drive material feedstock when the feed dogs are moved in one direction (toward the distal nozzle end) and which can slide back along the feedstock without inducing motion in the feedstock to effect the reverse portion of the reciprocation motion. The feed dog teeth 1104 can bite into the feedstock to create a positive interlock during the forward portion of the reciprocation. Alternatively, the teeth 1104 can interlock with pre-existing serrations, indentations or other features on the feedstock.

The reciprocation motion can have a continuous speed or it can have different speeds for the forward and reverse portions of the motion, for example the reverse portion can happen much faster than the forward portion so that more than one feed dog can be pushing forward on the feedstock at any given time. There can be more than two feed dogs 1102, for example there can be pairs or groups of feed dogs on each side of the feedstock so that there is always at least one feed dog on each side of the feedstock pushing forward at any given time. The motion of the various feed dogs can be coordinated so that while the motion of each individual feed dog can be reciprocal, the net motion imparted to the feed stock can be continuous forward motion or any desired motion profile. Different reverse feed dogs can be employed to effect reverse motion of the feed stock when needed. Or all feed dogs can be pulled backward at the same time which may create reverse feedstock motion.

Even though FIG. 11*a* shows an articulating material dispensing system, the linear or reciprocating feed dog system described here may also be used in a non-articulating (i.e. straight) material dispensing system and may have advantages such as increased drive force and more consistent feed drive ratio with less variation of feedrate or feed ratio between different types of material feedstocks.

FIG. 11*b* shows one possible construction of a flexible feed dog 1102 that can be used in a system such as that shown in FIG. 11*a*. Here, an isometric view of a part of a feed dog made of sheet metal is shown. The feed dog includes flexible teeth formed in the sheet metal. Flexible teeth can be helpful in that they can positively grab the feedstock when moving forward and can slide relative to the feedstock when moving in reverse. A feed dog made of thin, flexible sheet metal can be used to drive the feedstock around a bend as in the system of FIG. 11*a*.

Figure 12:
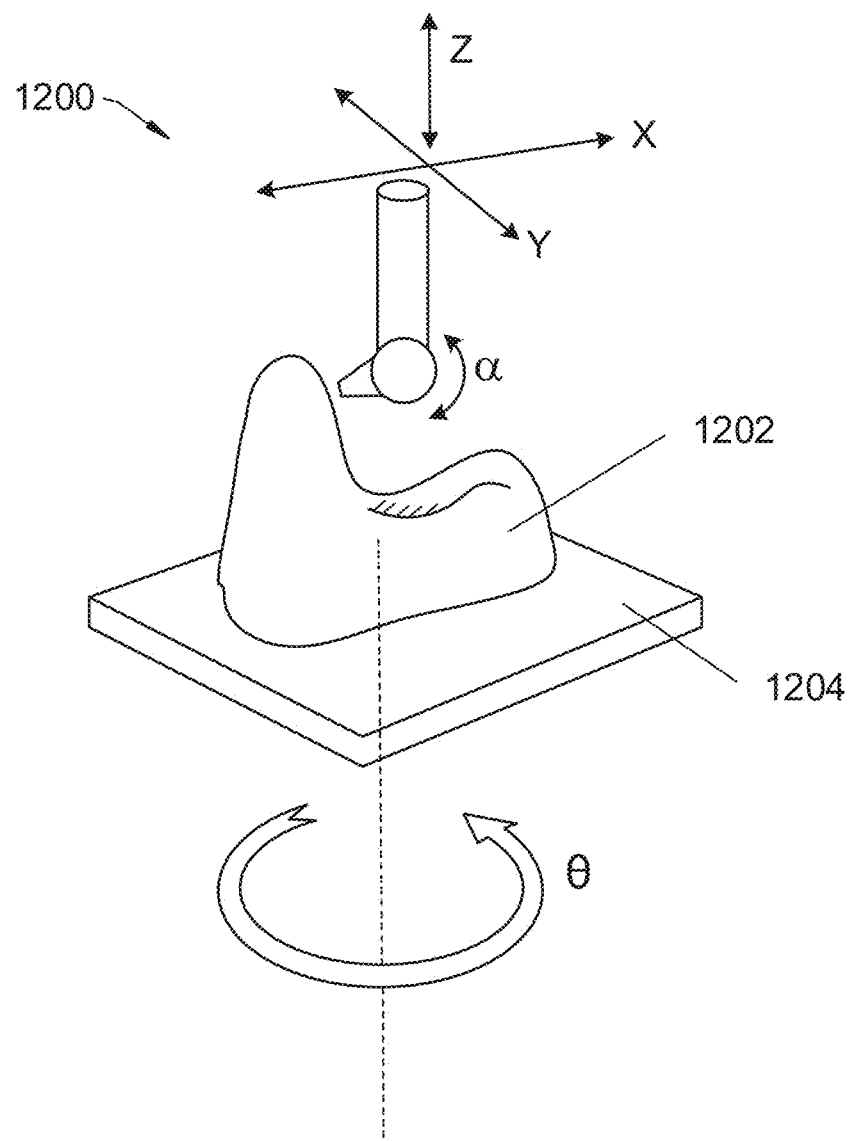
FIG. 12 shows an isometric view of an example implementation of an articulating material dispensing system having a rotating base.

FIG. 12 shows a different way to create a 5 (or more) axis material deposition system. The alternative system 1200 shown in FIG. 12 can include three linear motion axes, for example X, Y and Z. The system 1200 can include movement about a first rotational axis, such as $\alpha$, allows angular articulation of a nozzle very close to the exit orifice. Having a non-vertical rotation axis (in this case a horizontal axis) located close to the exit orifice, can allow the nozzle to fit into tight spaces while still articulating, for example to deposit material on the inside of cavities in parts. Moreover, a part 1202 that is being formed can be rotated about a second rotational axis, such as $\theta$. This can be achieved, for example, by placing the part 1202 on a rotatable base 1204 that can be rotated during deposition. The combination of the X,Y,Z, $\alpha$ and $\theta$ movements, then, as shown in FIG. 12, enables full 5-axis motion without some of the complications that may be associated with articulating a nozzle with two rotational axes.

Figure 13A:
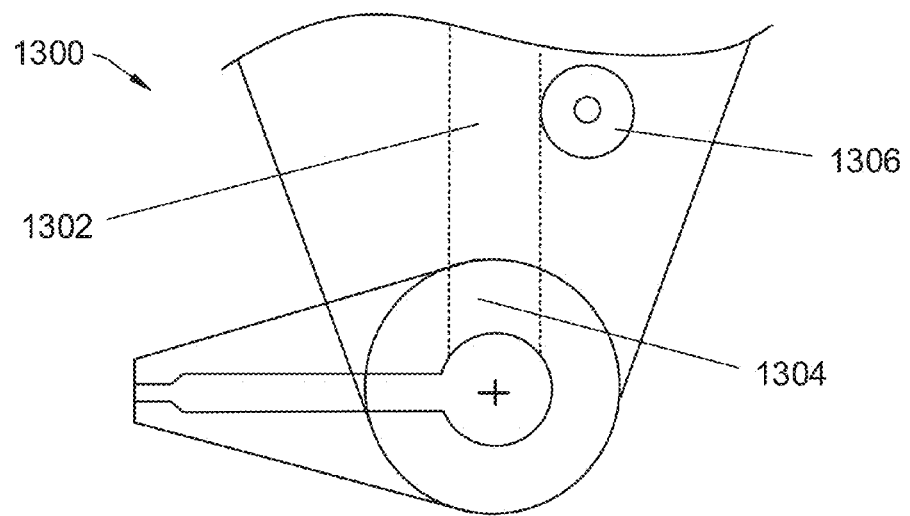
FIGS. 13a-13b show side and front cross sections views of another example implementation of an articulating material dispensing system.
Figure 13B:
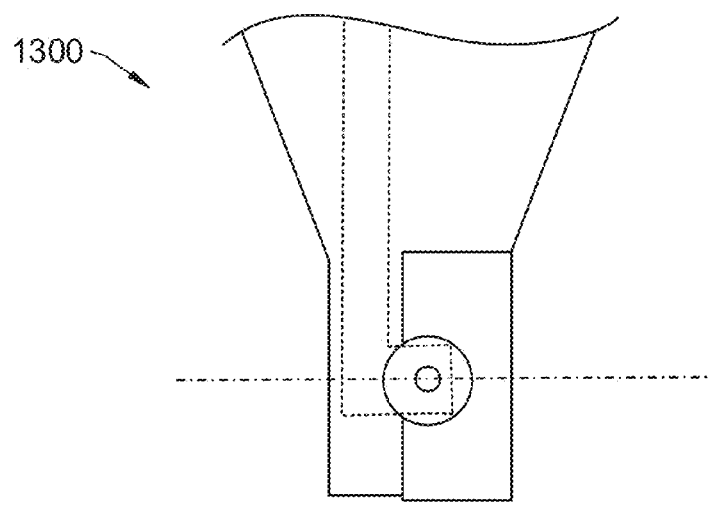

Referring now to FIGS. 13*a* and 13*b*, a material dispensing system 1300 with a nozzle mounted on a rotational axis is shown. Here, feedstock within a feedstock channel 1302 can be softened or liquefied in a liquefaction zone 1304 before it reaches the nozzle rotation axis. A drive wheel 1306 can be used to drive the feedstock through. Feedstock material can then flow sideways through a jog that is coincident with the nozzle rotation axis and then flows out through the nozzle. The jog coincident with the nozzle rotation axis can allow the nozzle to articulate through a range of motion while still providing a continuous, leak-free flow path for the feedstock material.

Figure 14A:
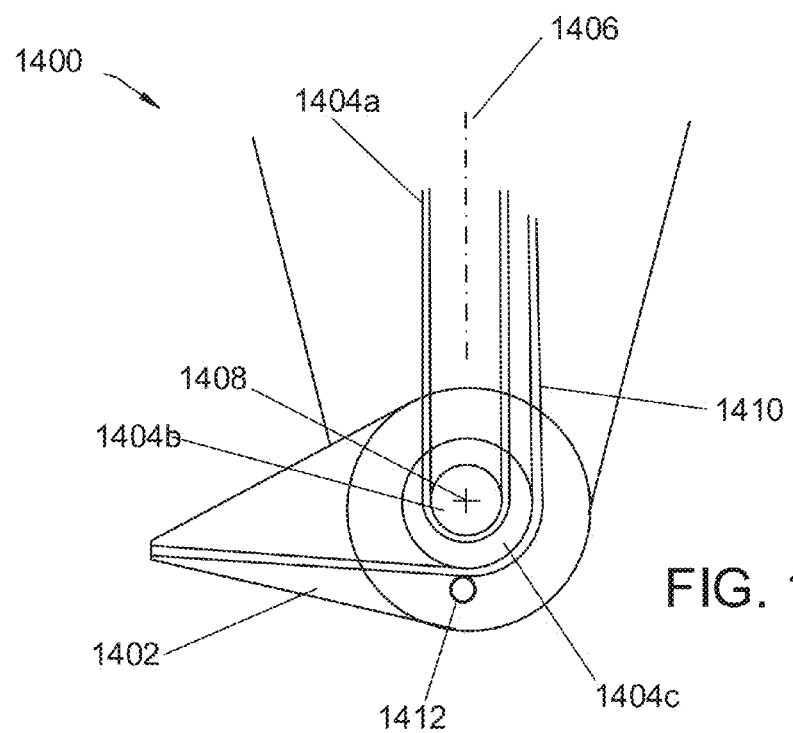
FIGS. 14a-14b show side cross section views of another example implementation of an articulating material dispensing system.
Figure 14B:
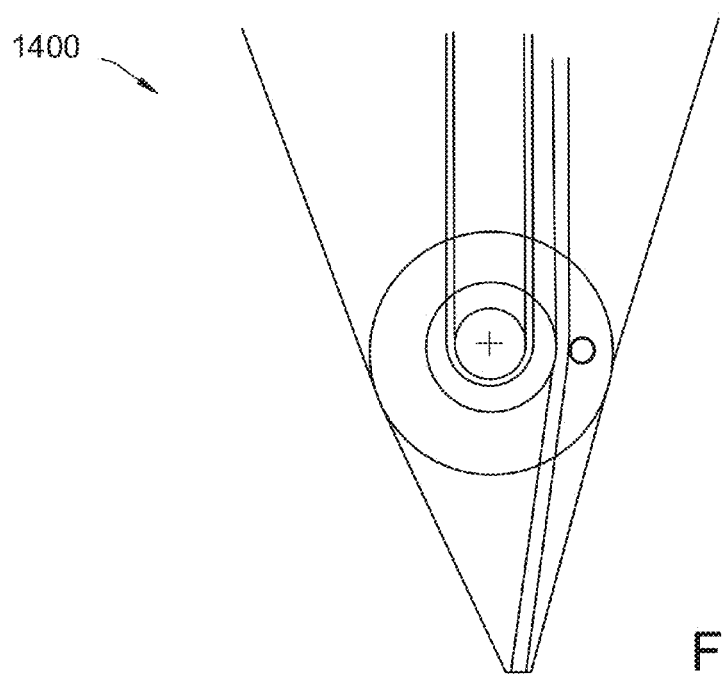

Referring to FIGS. 14*a* and 14*b*, a material dispensing system 1400 with a nozzle 1402 configured to rotate about two rotational axes is shown. The system 1400 also includes a material drive system (e.g. 1404*a-c*) that accommodates the range of motion of the nozzle rotation. An optional first rotation axis 1406 is shown with a vertical orientation. The nozzle can rotate about this vertical axis if this degree of freedom is present. A second rotational axis 1408 can be perpendicular to the first rotational axis 1406 (shown as horizontal, in/out of the page). Feedstock material 1410 is fed by a drive wheel 1404*c* to the nozzle 1402 having an exit orifice. FIG. 14*a* shows a side view of the system 1400 in a fully articulated position, and FIG. 14*b* shows a side view of the system 1400 in a non-articulated (vertical) position.

Here, the feedstock 1410 follows a path that is off to the side so that it can wrap around the drive wheel 1404*c*, and so that the drive wheel 1404*c* can be centered on the second rotational axis 1408. Having the drive wheel centered on the second rotational axis enables the drive wheel to stay in the same location as the nozzle rotates about the second axis. Having the drive wheel stay in the same position means that it can be driven by a belt 1404*a* from above. Additionally, having the feedstock wrap around the drive wheel can facilitate bending the feedstock around the corner when the nozzle is in an articulated position. The radius of curvature can be larger in this configuration than it would be if the feedstock had to travel axially along the nozzle and the upper portion of the dispensing system. The feedstock material can exit the nozzle in-line with the nozzle axis because the feedstock path through the nozzle can guide it from being non-axial to becoming aligned with the nozzle axis just before it exits. An idler bearing can maintain pressure between the feedstock and the drive wheel. The idler bearing 1412 can be spring loaded so that it applies a relatively constant force to pinch the feedstock between itself and the drive wheel. The idler bearing can be affixed to the nozzle portion of the dispensing system so that when the nozzle rotates about the second axis, the idler bearing rotates with it so that it is always pinching the feedstock to the drive wheel just at the point before the feedstock enters the body of the nozzle, which can help in getting the feedstock to travel around the bend. The drive wheel can be actuated by a drive belt that can be driven by a motor or other actuator that is proximal of the drive wheel. In some cases, an additional set of drive belt and pulley can be used to control the articulation of the nozzle 1402 about the second rotation axis. The drive wheel motion can be coordinated with the rotation of the nozzle about the second axis so that the feedstock is not inadvertently fed or retracted when the nozzle rotates about the second axis.

Figure 15A:
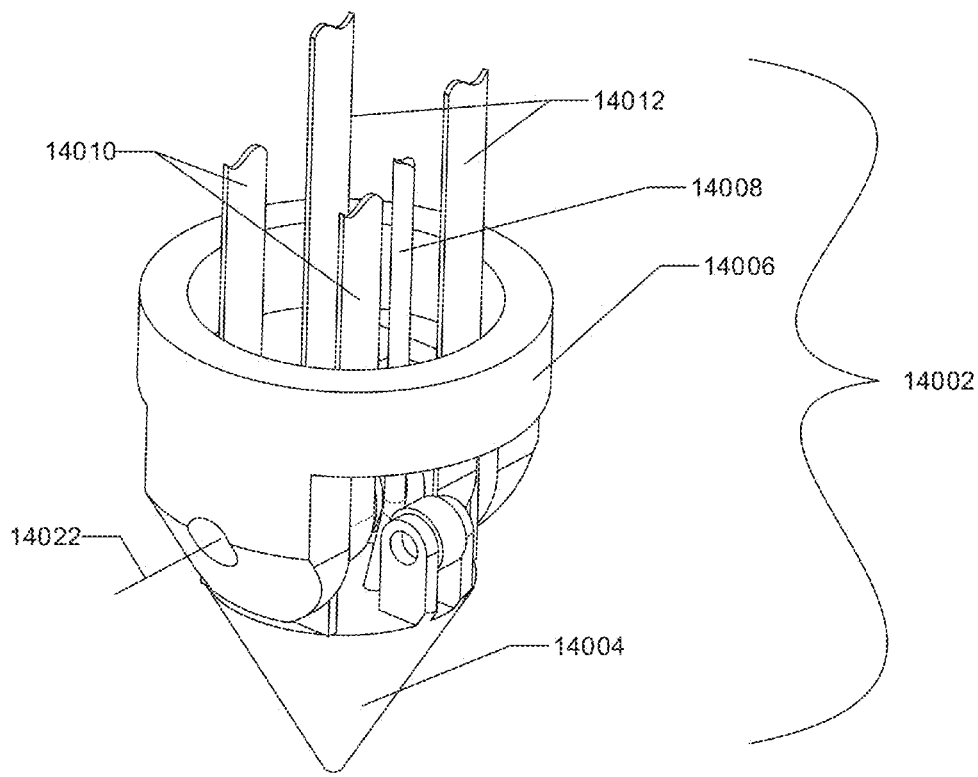
FIGS. 15a-15e show various views of another example implementation of an articulating material dispensing system.

FIGS. 15*a*-15*e* show another implementation of the multi axis material deposition system. Referring to FIG. 15*a*, an isometric view of a multi-axis material deposition system 14002 is shown. A material deposition nozzle 14004 is rotatable with respect to a base 14006 about a rotation axis 14022. A material 14008 which can be a filament can be fed through nozzle 14004. The base 14006 can move along, for example, the x, y, z axes and may be referred to as a movable support relative to which the nozzle 14004 can rotate. A feed drive belt 14010 can be used to transfer feed forces in order to feed material 14008. A nozzle positioning drive belt 14012 can be used to transfer positioning forces in order to rotate nozzle 14004.

Figure 15B:
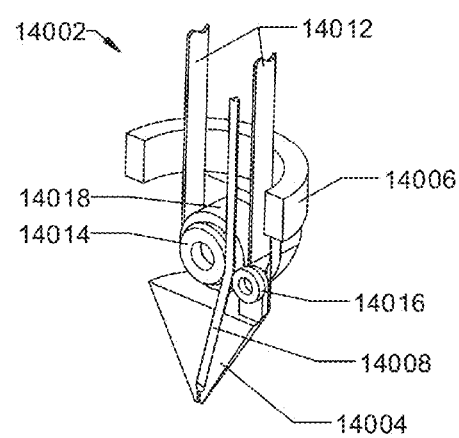

Referring to FIG. 15*b*, a path of material 14008 through nozzle 14004 is visible. Hatching has been omitted for clarity. A material drive wheel 14014 can drive material 14008 with the aid of a pinch roller 14016. Positioning drive belt 14012 can drive a positioning pulley 14018.

Figure 15C:
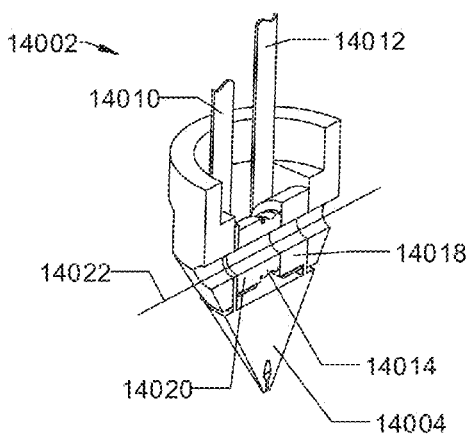

FIG. 15*c* shows an isometric section view of system 14002 with the section plane passing through nozzle rotation axis 14022. As shown, a positioning pulley 14018 is driven by positioning drive belt 14012 and is connected to nozzle 14004 so that when positioning drive belt 14012 moves, it results in rotation of nozzle 14004 about axis 14022. Drive wheel 14014 is connected to a material drive pulley 14020 which is driven by belt 14010 so that when belt 14010 moves, material 14018 (see FIG. 15*b*) is fed through nozzle 14004.

Figure 15D:
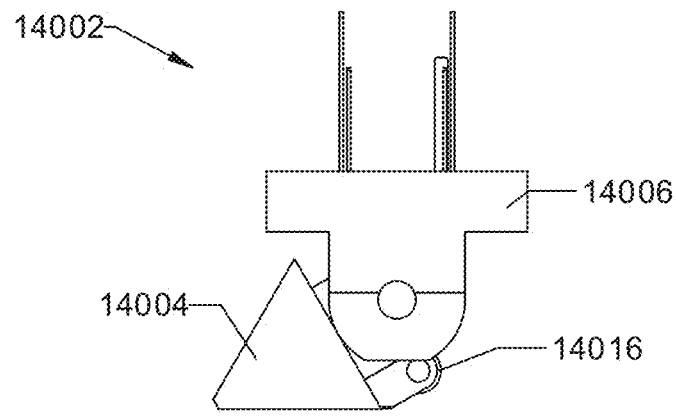
Figure 15E:
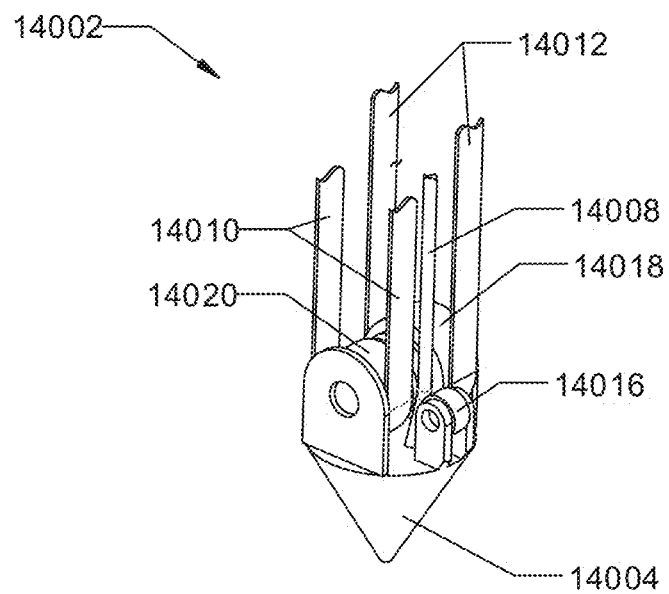

FIG. 15*d* shows a front view of system 14002 in which nozzle 14004 is in a rotated position with respect to base 14006. FIG. 15*e* shows an isometric view of system 14002 with base 14006 removed for clarity to show the other components.

Figure 16:
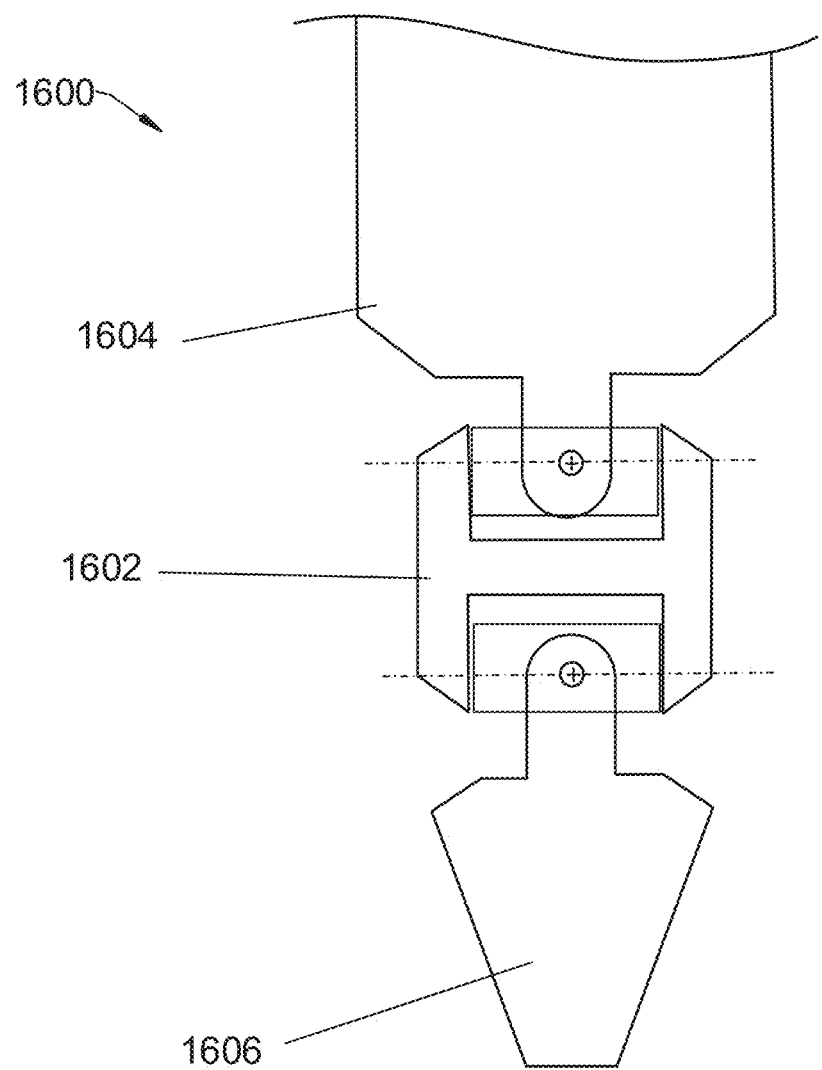
FIG. 16 shows a side view of another example implementation of an articulating material dispensing system.

Referring now to FIG. 16, another version of a material dispensing system 1600 having multiple rotational degrees of freedom is shown. Here, a center coupler 1602 couples a main body 1604 and a nozzle 1606. Additional linkage parts between the coupler and the main body and the coupler and the nozzle can be used but are not shown here for sake of clarity.

As shown, there are four rotation axes: two parallel rotation axes that are horizontal in the plane of the page; and another two parallel horizontal rotation axes that are projecting in and out of the plane of the page. Using multiple parallel axes means that rotation at each axis can be limited, for example limited to 45 degrees, which can be helpful in avoiding instability or lock-up conditions. Cables, pushrods or other actuators can be used to control the rotation of the nozzle relative to the base part. Elastomeric, springy, or compliant members can be connected to the nozzle, coupler and base part to create predictable, deterministic motion given simple push/pull inputs from cables or actuators. In some cases, additional linkages can be employed to further constrain motion, for example linkages or gears can be used to constrain the angular rotation about pairs of parallel axes to be equal or to be in some other deterministic ratio.

Referring now to FIGS. 17-24, additional implementations of the interlocking feature, similar to those described above in FIG. 5, are described. FIG. 17*a* shows an isometric view of an element 16002 which can be made of a continuous material 16004. Element 16002 can have an interlocking feature 16006 in one or more locations. Interlocking features 16006 can have a neck 16008 and one or more locking areas 16010. FIG. 17*b* shows a top view of the element 16002, and FIG. 17*c* shows a front view of element 16002. Interlocking features 16006 with neck 16008 and locking areas 16010 can be seen.

Element 16002 can be formed by deposition of material 16004 such that element 16002 is continuous—i.e. it does not have any breaks in it. Material 16004 can be or can contain continuous fibers. Interlocking features 16006 can be formed by forcing continuous material into a cavity in another part or in previously deposited material (for example see FIGS. 21*a* and 21*b*). The exact structure of interlocking features 16006 can take a variety of forms and the exact packing or path of continuous material 16004 can vary considerably, but it can form neck 16008 and locking areas 16010 regardless of specific packing arrangement. This is similar to the way a length of rope pushed into a box will take the net shape of the box regardless of the specific coil or path of the rope. Material 16004 can be a thermoplastic, fibers, a thermoset, a metal, a composite, a medium with living cells, a biologic material, a mineral material or any combination thereof.

Figure 18:
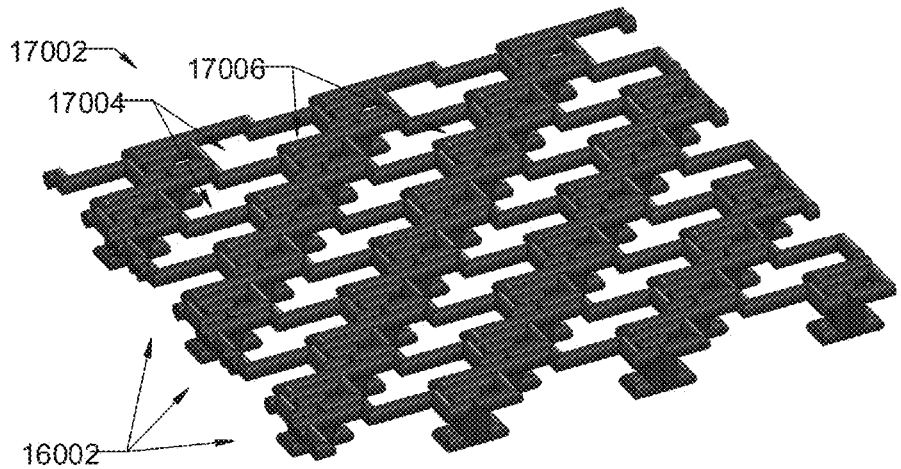
FIG. 18 shows multiple elements from FIGS. 17a-17c deposited next to each other.

Referring to FIG. 18, a layer 17002 made up of elements 16002 deposited next to one another is shown. Elements 16002 can be joined (all formed continuously) or they can be separate. Layer 17002 can be a planar array of elements 16002 or it can be non-planar or it can be curved or it can be irregular. Gaps 17004 and 17006 are left between elements 16002 in areas where elements 16002 don't touch. Gaps 17004 can be larger than gaps 17006.

Figure 17A:
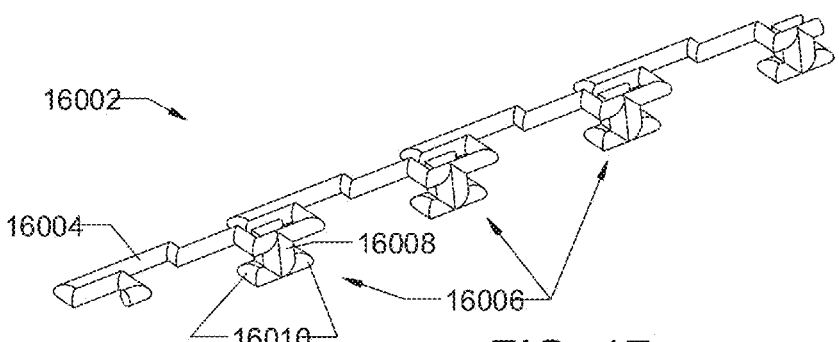
FIGS. 17a-17c show isometric, top, and front views of an example deposited element having an interlocking feature.
Figure 17B:
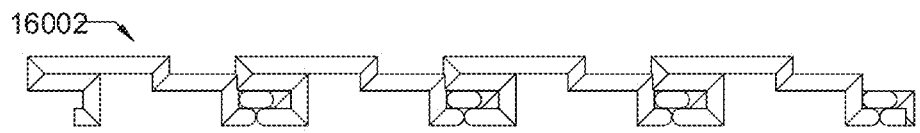
Figure 17C:
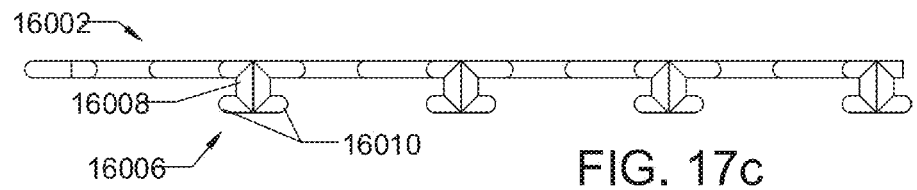
Figure 19A:
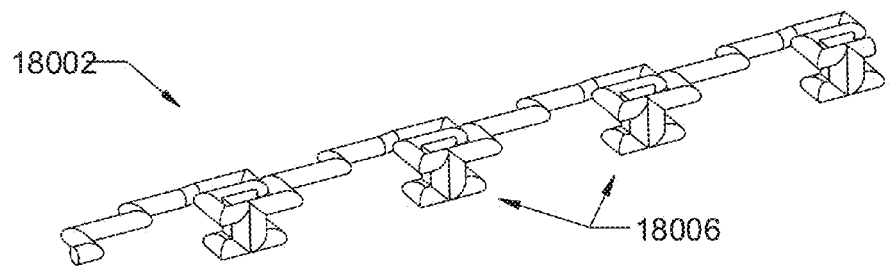
FIGS. 19a-19c show isometric, top, and front views of another example deposited element having an interlocking features.
Figure 19B:
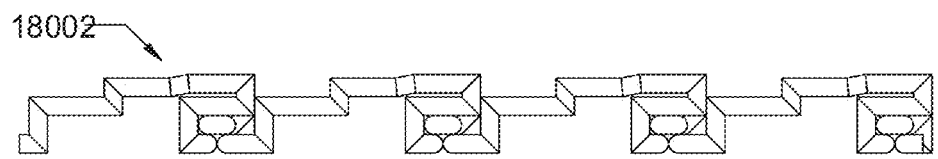
Figure 19C:
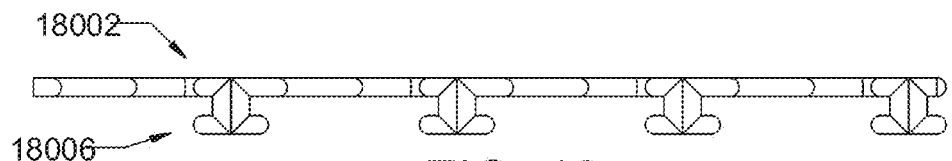
Figure 20:
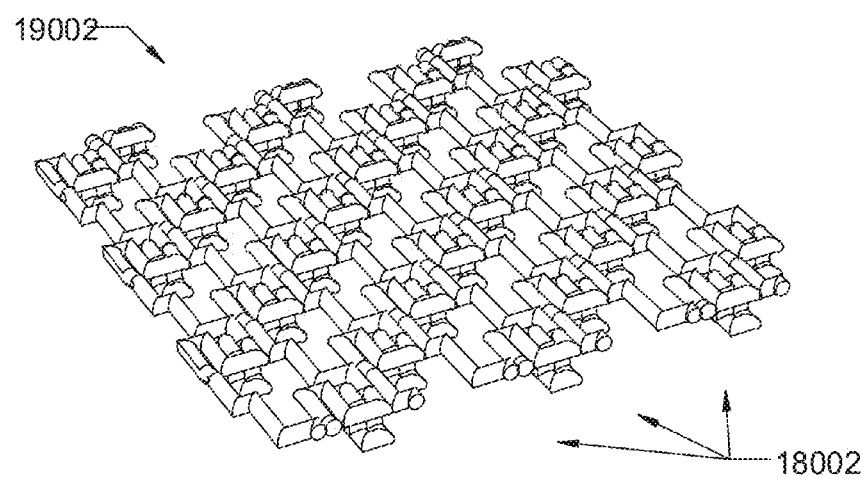
FIG. 20 shows multiple elements from FIGS. 19a-19c deposited next to each other.

FIGS. 19*a*-19*c* show isometric, top, and front views, respectively, of an element 18002, which is generally similar to element 16002 of FIGS. 17*a*-*c*, but can have a different shape or be formed in a different orientation. Element 18002 can have interlocking features 18006 similar to interlocking features 16006. FIG. 20 shows a layer 19002 made up of elements 18002 deposited next to one another. Layer 19002 can be similar to layer 17002 but it can be formed in a different orientation and it can be formed on top of layer 17002 (see FIG. 21*a*).

Figure 21A:
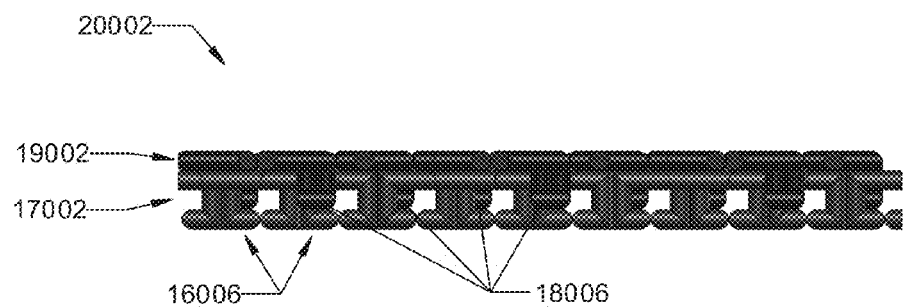
FIGS. 21a-21b show front and isometric views of an example two-layer interlocking structure.
Figure 21B:
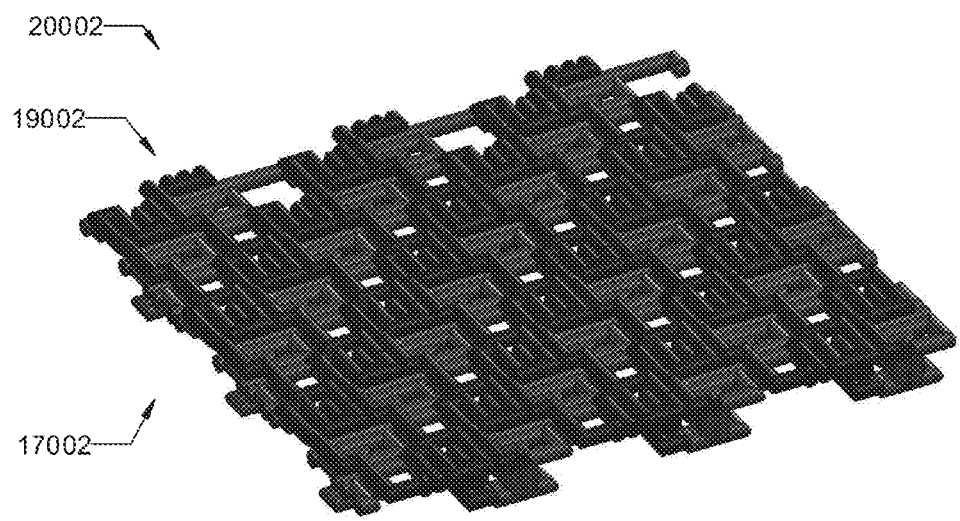

FIGS. 21*a* and 21*b* show an incomplete part with two layers together. This represents layers in a partially built part. In detail, FIG. 21*a* shows a front view of a part 20002 which includes layer 17002 and layer 19002. Interlocking features 16006 and 18006 are visible as part of layers 17002 and 19002 respectively. Interlocking features 18006 can have their shape defined as they are formed by being pushed into spaces in the shape of layer 17002, such as gaps 17004 and 17006. FIG. 21*b* shows an isometric view of part 20002.

Figure 22A:
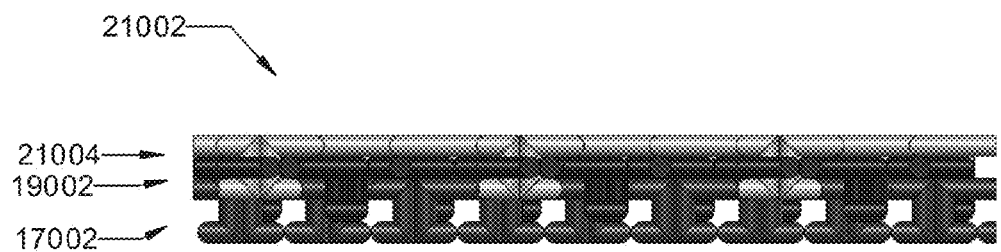
FIGS. 22a-22b show front and isometric views of an example three-layer interlocking structure.
Figure 22B:
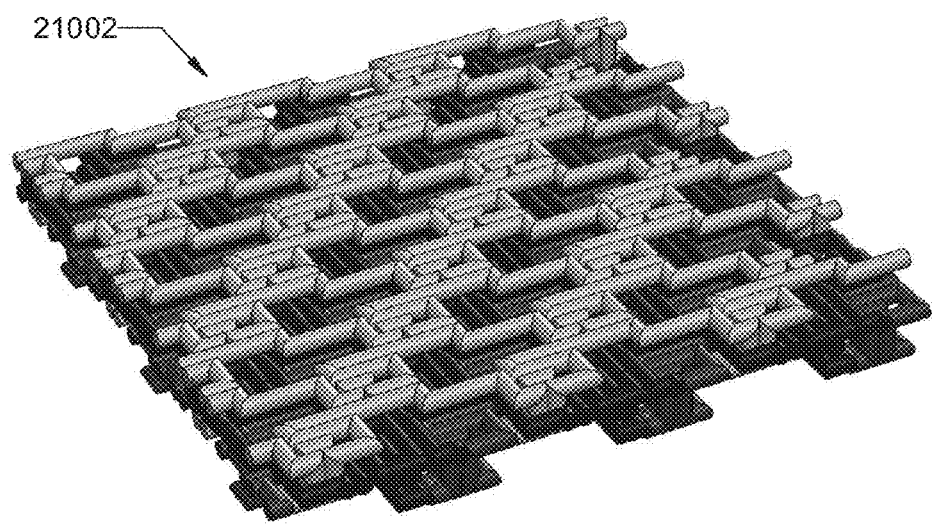

Referring now to FIGS. 22a and 22b, a part that is being built with three interlocking layers together is shown. In more detail, FIG. 22a shows a front view of a part 21002. Part 21002 includes layers 17002, 19002 and a third layer 21004. Layer 21004 can be the same as layer 17002, but the pattern is shifted. Locking features (not visible) from layer 21004 pass though narrow gaps in layer 19002 and fill larger gaps in layer 17002. The narrow gaps can be similar to gaps 17006 in FIG. 18. However, such gaps are not visible in this figure. The larger gaps can be gaps 17004. By taking the shape of the narrow gaps in layer 19002 and then filling the larger gap in layer 17002, an interlocking feature of layer 21004 can create a physical interference or lock between the layers which can prevent separation of the layers. A physical interference can be stronger and be more effective at preventing delamination of layers than a chemical bond alone. Material including strong fibers can thus be oriented transverse to the layers in the interlocking features and the strength of part 21002 can be closer to isotropic than in a typical part without interlocking features or transverse fibers between layers.

Figure 23A:
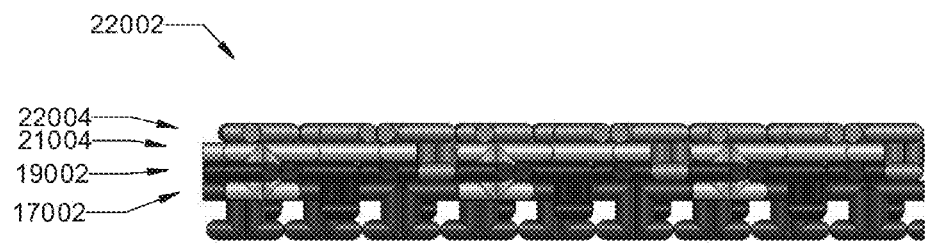
FIGS. 23a-23b show front and isometric views of an example four-layer interlocking structure.
Figure 23B:
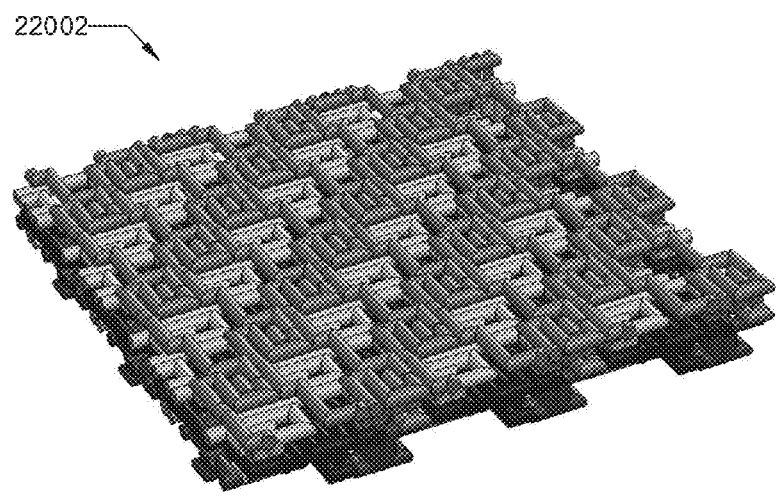

FIG. 23a shows a front view of a part 22002 made of four interlocking layers including layers 17002, 19002, 21004 and a fourth layer 22004. Layer 22004 may be the same as layer 19002 but it can be shifted to fit properly and achieve the desired arrangement of gaps and locking features. A set of 4 layers such as part 22002 may form a repeating unit, that is no more unique layer shapes or states are needed to continue to build the part. A fifth layer added on top of layer 22004 can be identical in shape and lateral position (shift) to layer 17002. Sets of these four layers can be repeated indefinitely to achieve a desired part thickness. FIG. 23b shows an isometric view of part 22002.

Figure 24A:
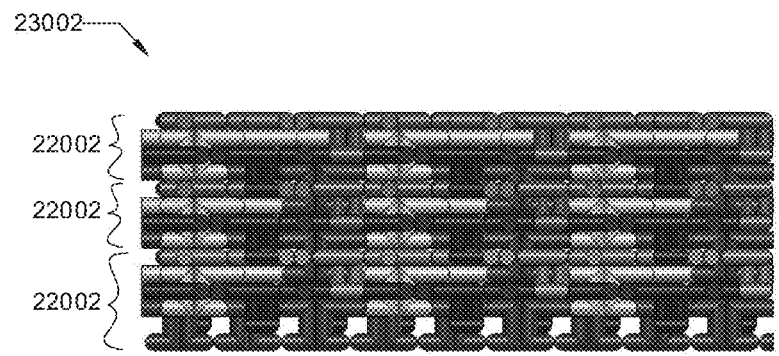
FIGS. 24a-24b show front and isometric views of an example twelve-layer interlocking structure.
Figure 24B:
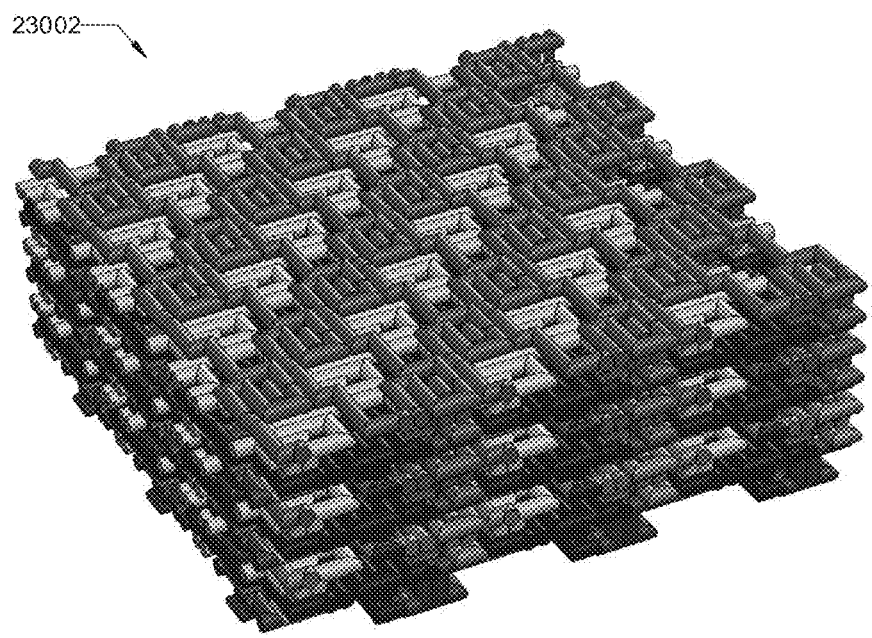

Referring now to FIGS. 24a and 24b, a part that is being built with twelve interlocking layers together is shown. FIG. 24a shows a front view of a part 23002 made of three parts 22002, which are each four interlocking layers, arranged so that part 23002 has a total of twelve interlocking layers. FIG. 24b shows an isometric view of part 23002.

In all implementations shown above, all layers can be made of a single continuous material or fiber or fiber bundle. In some cases, each layer or element can be made of separate materials or fibers or fiber bundles.

In addition, various implementations can employ systems and techniques to build composite parts more quickly, with improved material properties (e.g., greater strength and recyclability), or both. These systems and techniques can include using separate matrix and fiber materials as described below. For example, FIGS. 25a-25i show aspects of a composite material deposition system in which a solid (not melted) fiber thread or yarn may be guided separately from or together with a material deposition system, which includes a nozzle, and melted polymer flows through the nozzle and embeds in the solid fiber thread as the nozzle passes over the thread. Also, thread may be actively guided to the correct side of the nozzle (e.g., the side of the nozzle in the front of the direction of motion).

Figure 25A:
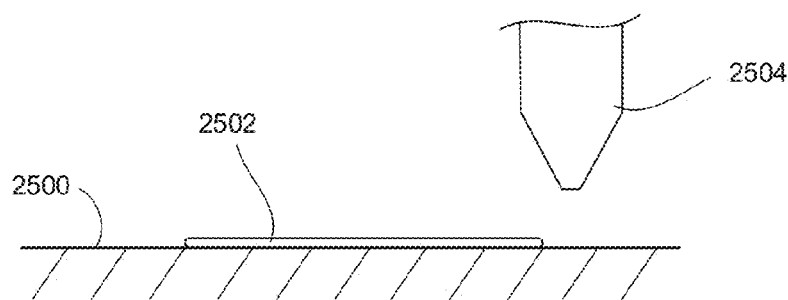
FIG. 25a shows a first layer of matrix material, such as a polymer that has been deposited onto a printing base by a material deposition system by a nozzle.

FIG. 25a shows a first layer of matrix material 2502, such as a polymer that has been deposited onto a printing base 2500 by a material deposition system by a nozzle 2504. The matrix material 2502 can also be a metal, metal/polymer composite, wax/metal composite, biologically based resin, ceramic, ceramic composite, silicone, urethane, rubber, elastomer, or other thermoplastic polymer, thermoset polymer, light curable polymer, heat curable polymer, pressure curable polymer, biologically seeded material, fungus, hydrogel, cell tissue slurry, bacterial slurry, plant tissue slurry, animal tissue slurry, cement, concrete or other mineral material or other soft or hardenable material, or a combination thereof. Such materials can be deposited on the printing base 2500 using known systems and techniques or using the system and techniques described herein.

Figure 25B:
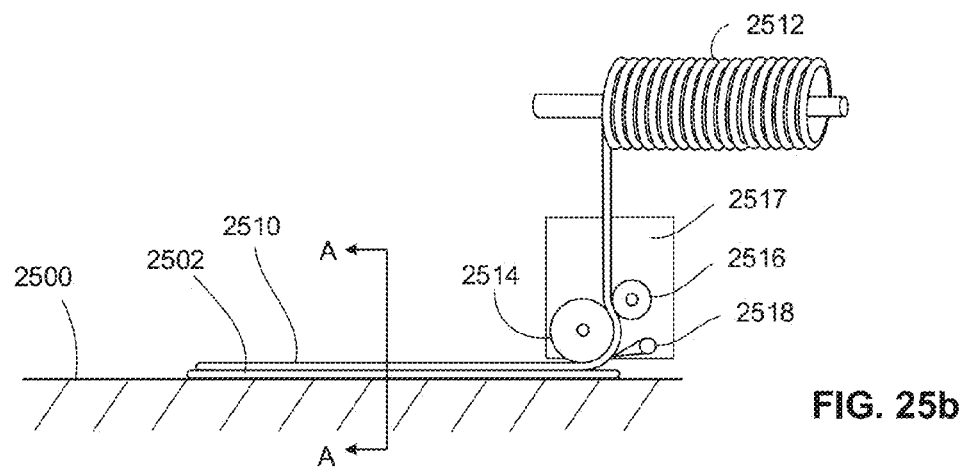
FIG. 25b shows the printing base and the first layer of matrix material from FIG. 25a with a layer of fiber or other solid material being applied on top of the first layer of matrix material.

FIG. 25b shows the printing base 2500 and the first layer of matrix material 2502 from FIG. 25a with a layer of fiber 2510 or other solid material being applied on top of the first layer of matrix material. In various implementations, the fiber can be carbon fiber, glass fiber, yarn, natural fiber (such as wool, cotton, wood fiber), ceramic fiber, metal fiber, polymer fiber such as PET (Polyethylene Terephthalate), spectra, nylon, carbon nanotube fiber, continuous fibers, short fibers, oriented fibers, random orientation fibers, twisted fibers, knotted fibers, spun yarn or weave of discontinuous short fibers, chopped fibers in a matrix, particles in a matrix or other fiber.

The fiber 2510 can be fed from a spool 2512. In some implementations, the fibers 2510 are "dry", while in other implementations the fibers 2510 are already impregnated with a matrix material. One or more rollers 2514, 2516 can be attached to a roller support structure 2517 and be used to guide the fiber 2510 as it is deposited. A first roller 2514 can be heated and heat the fiber 2510 and/or the matrix material 2502 as the fiber 2510 is deposited. In some implementations, the heat from the first roller 2514 can melt (or re-melt) the matrix material 2502 to facilitate depositing the fiber 2510 therein. For example, the controller for the system can be designed to melt (or re-melt) a portion of the matrix 2502 when a first part of a section of fiber 2510 is laid down, then allow this portion to cool before proceeding to lay down the rest of the section of fiber 2510, thus creating an anchor point for the fiber 2510. In some implementations, such anchor points can also be created at various points along the section of fiber 2510 being laid down, such as turning points in the lay down path. This can facilitate the creation of sharp angles in the pattern of fiber 2510 deposited on the matrix 2502.

In some implementations, roller 2514 can press the fiber 2510 into the matrix material 2502 to bond it to the matrix material. The matrix material 2502 can partially melt in order to bond to or encase the fiber 2510 or the matrix material 2502 can be an uncured or tacky substance so that roller 2514 can press the fiber 2510 into the matrix material 2502, which can be sufficient to hold the fiber 2510 in place and attached to the matrix material.

A second roller 2516 can also guide the fiber 2510; in some implementations, the second roller 2516 is also heated. Roller 2514 and/or roller 2516 can be driven and serve to feed the fiber 2510 forward and/or backward as needed. In other cases, rollers 2514 and 2516 may have a controlled resistance to rolling, or they may be free spinning A cutter 2518 can be used to cut the fiber 2510 at desired points. The cutter 2518 can be passively configured to cut the fiber 2510 when the fiber 2510 is retracted (driven backward), or the cutter 2518 can be actively controlled to cut the fiber 2510 at any desired location. A section line A-A is shown to indicate the direction of section views shown in FIGS. 25c-25f.

Figure 25C:
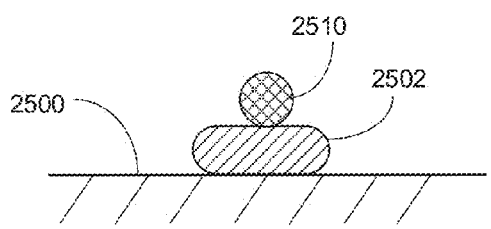
FIG. 25c shows a cross section view in a location of FIG. 25b.

FIG. 25c shows a cross section view in a location of FIG. 25b. The printing base 2500, matrix material 2502 and fiber 2510 are shown in FIG. 25c as the fiber 2510 is just being deposited onto the matrix material 2502 but is not yet fully formed or pressed into the matrix material 2502 by the roller 2514.

Figure 25D:
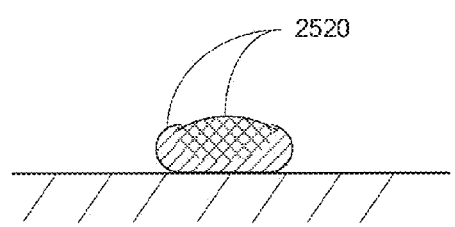
FIG. 25d shows the materials of FIG. 25c after a roller has heated and/or pressed the fiber into the matrix material.

FIG. 25d shows the materials of FIG. 25c after roller 2514 (not shown here but see FIG. 25b) has heated and/or pressed the fiber 2510 into the matrix material 2502. The heating and/or pressing of the fiber into the matrix material can cause the matrix material to encase and (in some implementations) flow and impregnate the fiber material. The resulting composite combination 2520 of materials can become homogeneous or it can have an area of mostly matrix material on some outer surfaces with an area with higher density of fibers on the inside and/or top surface.

Figure 25E:
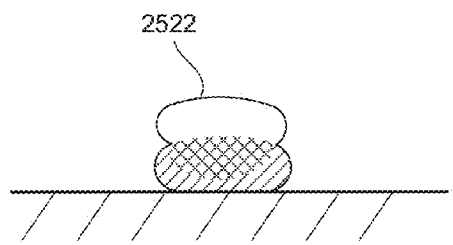
FIG. 25e shows the same setup and materials of FIG. 25d after another layer of matrix material has been added on top.
Figure 25F:
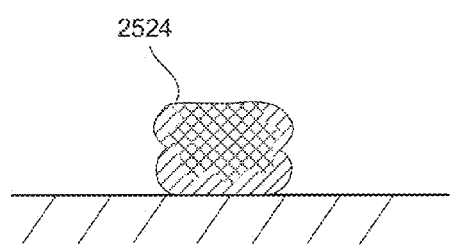
FIG. 25f shows the same setup and materials of FIG. 25e after another layer of fiber has been applied on top of matrix layer and has been compressed and/or heated to a second composite layer.

FIG. 25e shows the same setup and materials of FIG. 25d after another layer of matrix material 2522 has been added on top. FIG. 25f shows the same setup and materials of FIG. 25e after another layer of fiber has been applied on top of matrix layer 2522 and has been compressed and/or heated to a second composite layer 2524. The net result is a larger, taller composite structure of matrix material plus fiber that can have good adhesion between all the materials and good structural integrity.

In various implementations, the nozzle 2504 and fiber spool 2512 can be attached to the same arm, gantry or carriage in the extruder, the nozzle 2504 and fiber spool 2512 can be attached to separate arms, gantries or carriages, or the nozzle 2504 and fiber spool 2512 can be removably attached to an arm, gantry or carriage that includes a coupler for releasing a first tool and attaching a second tool in the extruder system. Moreover, multi-axis rotation systems and techniques described above can also be employed in the context of composite material fabrication.

FIG. 25g shows a simplified version of a system similar to that of FIG. 25b creating a more complex shaped part 2530. The matrix material deposition system (not shown) and the fiber deposition system can be coupled to a multi-axis motion system such as a gantry, delta mechanism or robot arm. The motion system can have 3, 4, 5, or more motion axes, such as described in detail above. For example, a 5 axis deposition system can enable the matrix material and fibers to be deposited on complex shapes.

FIG. 25g shows a 4 or 5 axis fiber deposition system depositing fibers 2536 on top of a curved part structure that has had one or more layers of matrix material 2534 previously applied. Layers of support material 2532 are also shown, which can serve to create a basic shape upon which to apply matrix material 2534 and/or fibers 2536. Support material 2532 can be the same as or different than the matrix material 2534. In some implementations, the support material 2532 is removable (e.g., by dissolving it) after the part 2530 is fabricated.

FIG. 25h shows another version of a fiber deposition system, which includes a nozzle 2540 with heating elements 2542. The heating elements 2542 can be nichrome or copper wire, or other partially electrically conductive material with a resistance that turns electrical energy into heat in a controllable manner. In some implementations, a single heating element 2542 is used, as in a wire that is wrapped in a spiral within the nozzle 2540. Note that the nozzle 2540, with heating elements 2542, can itself be constructed by additive manufacturing in some implementations. Alternatively, the heating elements 2542 can be made from carbon or a high temperature metal, and then the rest of the nozzle can be formed by casting aluminum or bronze around the heating elements 2542 with an insulating material (not shown) provided to prevent short-circuiting heating element(s) 2542. Alternatively, nozzle 2540 may be constructed from multiple pieces which fit together in close contact with heating element(s) 2542.

In any case, the nozzle 2540 is used to deliver the fiber 2544, and the nozzle 2540 can have smooth edges 2546 around an exit orifice, which facilitates pressing of the fiber into the matrix while laying the fiber down. Thus, the nozzle 2540 can heat and/or compress fibers 2544 into matrix material as the fibers 2544 are deposited. FIG. 25i shows the fiber deposition nozzle of FIG. 25h as being moved 2548 by a 4 or 5 axis motion system while depositing fibers using the system and techniques described above.

Note that the use of the heating element(s) 2542 in the nozzle 2540 can provide finer control of heating and cooling, which can facilitate the creation of sharp angles in the pattern of fiber deposited on the matrix, such as described above. This can assist in laying the fiber down at corners, both in an X-Y plane, and in other directions in a multi-axis system. Further, the provision of independent control of the laying down of matrix and fiber, rather than having the fiber already contained in and/or impregnated by the matrix so as to deposit both together, can result in additional advantages, such as more control over variations in the amount (and laydown patterns) of matrix versus fiber. For example, the controller for the extruder can be programed to vary feed rates or volume fractions of matrix versus fiber when building a part so as to improve the structural characteristics of the fabricated part and/or to accomplish non-planar deposition of fiber in matrix. In addition, when engaged in multi-axis FDM 3D printing certain areas can get squished together or spread apart depending on their curvature because paths are offset from 3D part surfaces, and in such cases, the extrusion ratio can be varied according to path spread (a proxy for which can be calculated from surface curvature and offset amount).

Figure 25J:
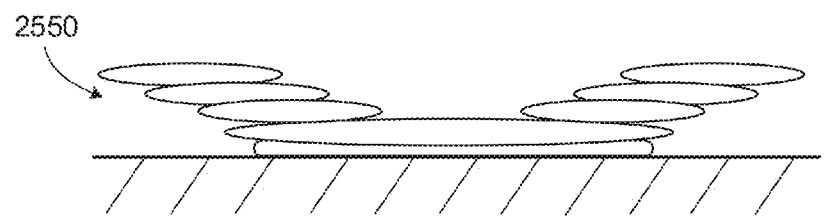
FIG. 25j shows another way of creating support material before adding composite material layers.
Figure 25K:
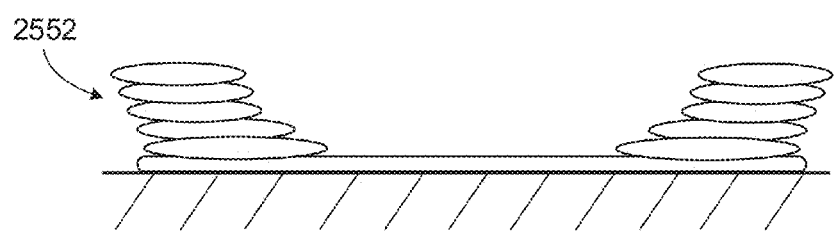
FIG. 25k shows another way of creating (possibly dissolvable) support material before adding composite material layers.

FIG. 25j shows another way of creating support material 2550 before adding composite material layers. In this example, the support 2550 is built up in steps that extend further outward in each layer to create a cantilever type structure as shown. Support material 2550 can be created by FDM processes. FIG. 25k shows another way of creating (possibly dissolvable) support material 2552 before adding composite material layers. In this example, there is less extension outward on each layer, as may be necessitated by the material used to create the support structure.

Figure 25L:
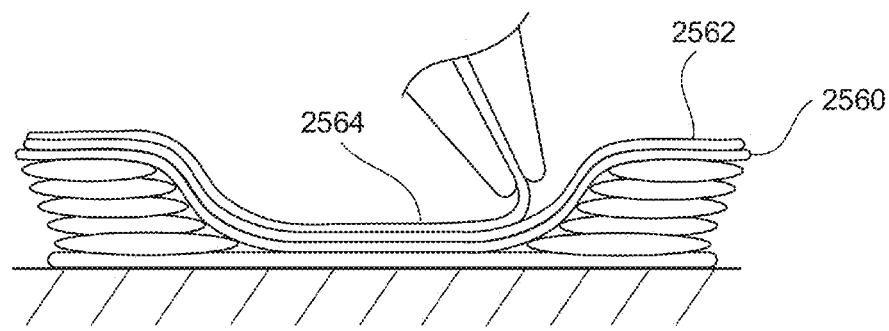
FIG. 25l shows composite material layers (matrix material and fibers) being added on top of support material in a non-planar manner.
Figure 25M:
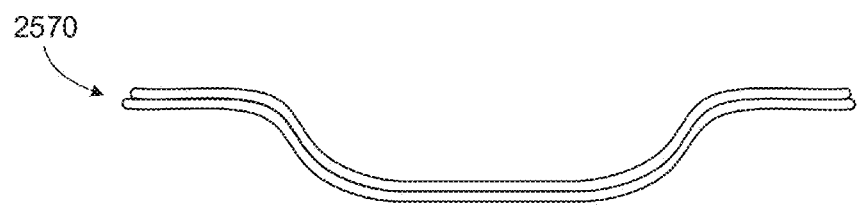
FIG. 25m shows a resulting composite material part after support material has been removed or dissolved.

FIG. 25l shows composite material layers (matrix material and fibers) being added on top of support material in a non-planar manner. Matrix material and fibers may be added by different deposition systems in alternate layers that become fused by heat and/or pressure, or matrix and support material may be added all at once as a combined material. A 4 or 5 axis nozzle system is shown adding composite material on top of support material layers. In this example, a first layer 2560 includes both matrix and fiber, which have been fused together, a second layer 2562 of matrix material has been added, and a fiber 2564 is being laid thereon, but not yet fused into the matrix layer 2562. FIG. 25m shows a resulting composite material part 2570 after the fiber 2564 is fused into the matrix layer 2562 and the support material has been removed or dissolved. In some other embodiments, matrix and fiber material may be applied simultaneously or in a pre-combined state.

Figure 26A:
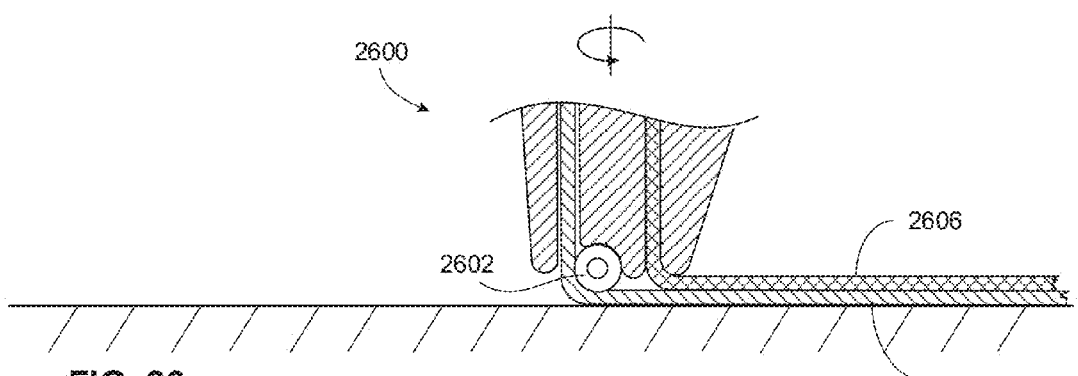
FIG. 26a shows a material deposition system for composite materials in which both a matrix material and a fiber material are deposited from the same head or nozzle and can be deposited simultaneously or at different times (sequentially).

In addition to the independent control described above by use of separate tools for provision of matrix versus fiber, in some implementations, a single tool can be used to separately laydown fiber and matrix, still achieving the independent control thereof. FIG. 26a shows a material deposition system for composite materials in which both a matrix material 2606 and a fiber material 2604 are deposited from the same head or nozzle 2600 and can be deposited simultaneously or at different times (sequentially). The deposition system of FIG. 26a shows fibers being deposited against a build platform, using roller 2602, and matrix material being deposited on top of the fiber material. The matrix material 2606 may encase the fiber material 2604 or impregnate it to become a homogenous or nearly homogenous composite material. The head or nozzle 2600 may be able to rotate (for example about an axis that is vertical in FIG. 26*a*) so that the matrix material can always be deposited on top of the fibers even when the head or nozzle reverses direction or travels around a curve relative to the part being built.

The head or nozzle 2600 can have additional axes of linear and/or rotational motion, for example linear motion in X, Y and/or Z axes and rotation about 1, 2, 3, or more axes. For example the head or nozzle 2600 can be mounted on a 5 axis motion system with 2 rotational axes or a 6 axis motion system with 3 rotational axes so that it is able to deposit fibers and/or matrix material onto a wide variety of surface shapes. There may be more linear motion axes or there may be 1, 2, or 3 linear motion axes coupled to the head or nozzle. Additional linear or rotational motion axes can move the printing base and the part being fabricated.

Figure 26B:
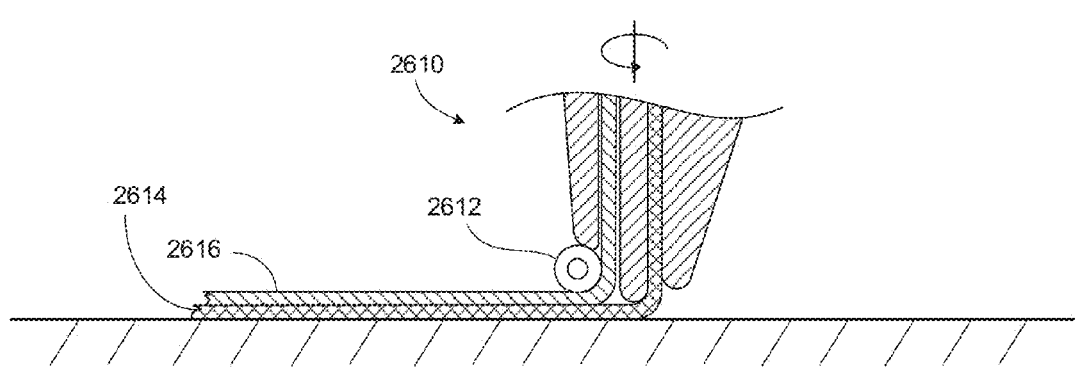
FIG. 26b shows a composite material deposition system similar to that of FIG. 26a except that the system is configured to deposit fiber material on top of the matrix material.

FIG. 26*b* shows a composite material deposition system 2610 similar to that of FIG. 26*a* except that the system is configured to deposit fiber material 2616 on top of the matrix material 2614, using roller 2612. The system of FIG. 26*b* can be configured with multi-axis motion control such as 5 or 6 axis motion control similarly to the system of FIG. 26*a*.

Figure 26C:
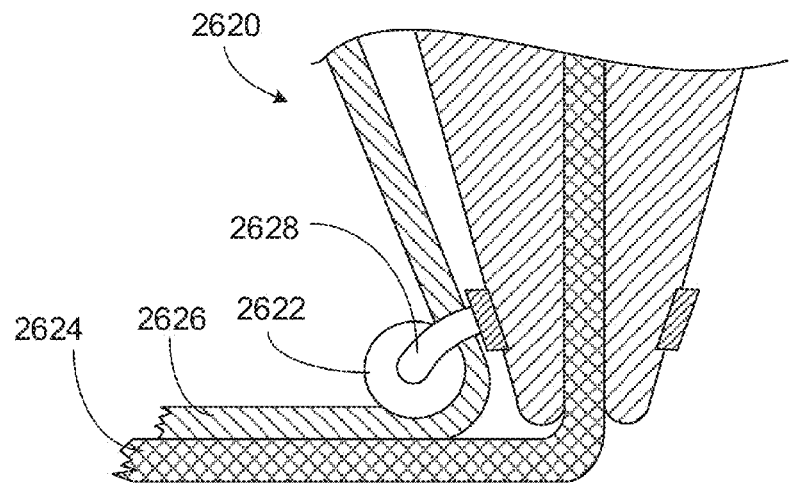
FIGS. 26c and 26d show a composite material deposition system similar to that of FIG. 26b with the addition of a roller on a swivel system or rotatable axis.
Figure 26D:
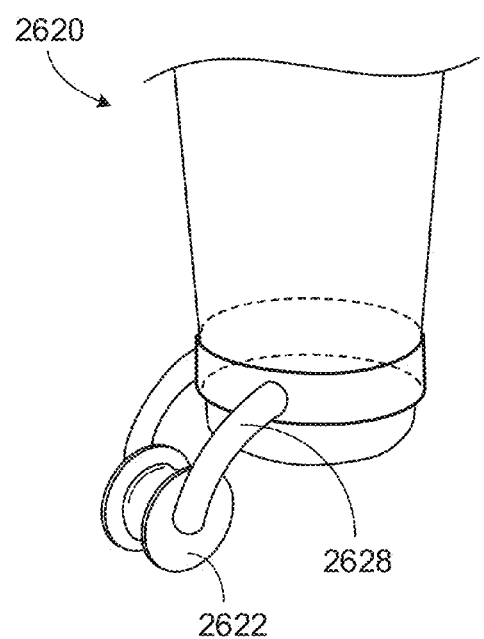

FIGS. 26*c* and 26*d* show a composite material deposition system 2620 similar to that of FIG. 26*b* with the addition of a roller on a swivel system or rotatable axis. FIG. 26*c* shows a cutaway side view of the composite material deposition system 2620 with roller 2622 and swivel system 2628 laying down matrix material 2624 and fiber 2626. FIG. 26*d* shows an isometric view of the system 2620 of FIG. 26*c*.

The roller 2622 of FIGS. 26*c* and 26*d* can be used to locate fiber material 2626 as it is being deposited. Fiber material 2626 can travel along the outside of a nozzle system and be pressed into place on top of a part with optional matrix material 2624 by the roller 2622. Matrix material 2624 or support material may be deposited via a central nozzle or orifice about which the roller swivel system can rotate. The roller 2622 can be mounted on the swivel system such that it passively rotates as the matrix material nozzle traverses a part, or its rotation can be actively controlled by an actuator (not shown). The nozzle can be configured to move with translational and rotational axes as described above. The roller and swivel system can be configured to move with the nozzle (except with its own extra rotational axis) or it can have its own additional actuated or passive rotational degrees of freedom. The roller swivel system can include a passive or active "suspension system" or preloading system so that it applies a predetermined pressure to the fiber material 2626 to bond it to the matrix material 2624. The roller and/or the nozzle can also be heated.

FIG. 27*a* shows a cross section of a material deposition system 2700 including orifices for dispensing fiber material 2704 and matrix materials 2702, 2706, such as thermoplastic or thermoset materials. The system of FIG. 27*a* shows fiber 2704 being deposited from a central orifice and multiple matrix material orifices built into the same system (potentially into the same head or nozzle). The multiple matrix material orifices can be used to dispense different types of matrix material (for example rigid thermoplastic from one orifice and thermoplastic elastomer from the other orifice). Other materials can also be dispensed in various implementations, such as a metal matrix material, and the matrix material 2702 can be alternate matrix material, with different properties, than that of matrix material 2706.

The multiple matrix material orifices can also be used to dispense the same matrix material with different flow rates, different deposition widths or in different locations. For example, the orifice locations can be such that matrix material is deposited on both sides of the fiber material 2704. The multiple matrix material orifices can also be used to deposit different components to create a desired chemical reaction, for example parts A and B of an epoxy, polyester or urethane resin.

FIGS. 27*b* and 27*c* show cross section views of different possible resulting material configurations 2710, 2720 that can be created by depositing fiber and matrix material with the system of FIG. 27*a*. In material configuration 2710, the fibers 2704 are encased in matrix material 2702, and the amount of this encasement can be controlled by the flow rates provided to the materials in the respective exit orifices of material deposition system 2700. In material configuration 2720, the material deposition system 2700 has been used to overlap layers and create interlocking structures, such as described in more detail above, and the fibers and matrix have been heated and become nearly homogenous.

Figure 28A:
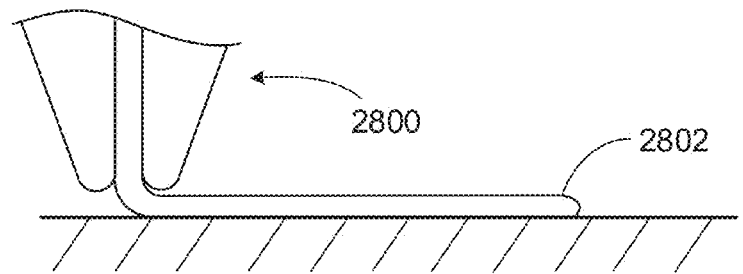
FIGS. 28a-28d show an example of using different tools in a process for creating composite materials in an automated system.
Figure 28B:
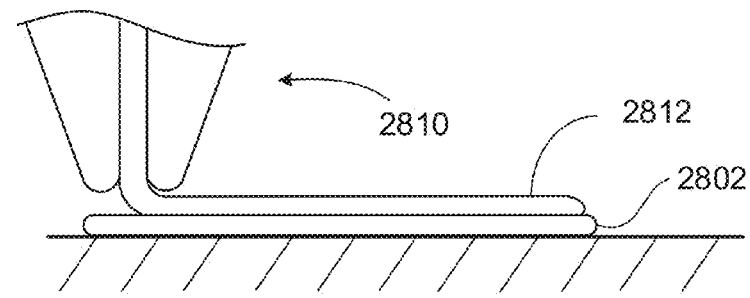

As noted above, in some implementations, the fiber and matrix materials can be delivered using separate tools. Further, additional different tools can be used in various implementations. FIGS. 28*a*-28*d* show an example of using different tools in a process for creating composite materials in an automated system. FIG. 28*a* shows a layer of matrix material 2802, such as thermoplastic, being deposited by a nozzle 2800 on a build base. This can be similar to a current typical FDM material deposition process, or it can employ some of the systems and techniques described above. FIG. 28*b* shows a layer of fiber material 2812 being deposited on top of the matrix material 2802 in a second pass. The fiber material 2812 can be deposited via a separate nozzle 2810 or fiber feed system, or it can be deposited by the same nozzle (using the systems and techniques described above). In some implementations, the deposited fiber material 2812 is "dry" (non melted) thread or yarn. In some implementations, the fiber 2812 can be heated so that it sticks to the matrix material 2802, or the matrix material 2802 can be heated locally in front of the fiber deposition process so that the fiber 2812 sticks to the matrix material 2802, or the matrix material 2802 can be uncured or inherently tacky so that the fiber sticks to it. Optionally, a heated roller or heated thread guide can be used to secure thread by pressing it into the thermoplastic layer below and partially re-melting it, such as described in detail above.

Figure 28C:
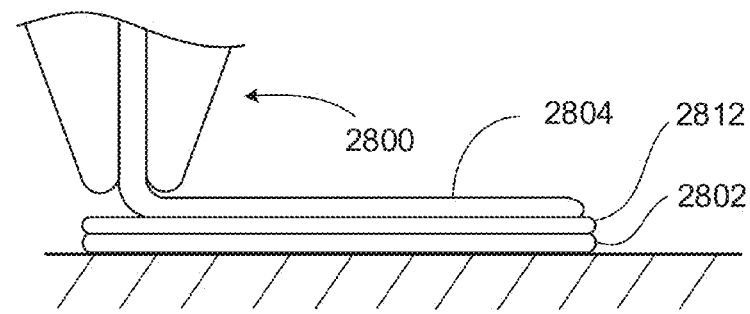
Figure 28D:
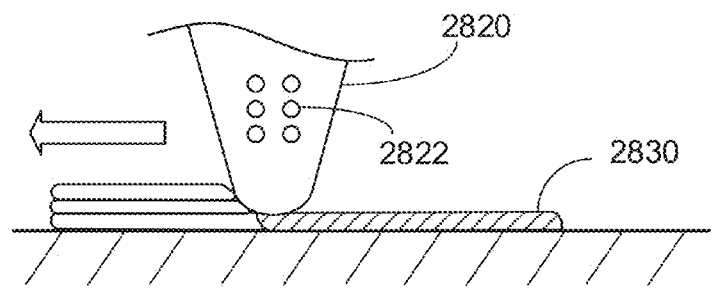

FIG. 28*c* shows an optional next layer of matrix material 2804 being added to the matrix material 2802 and fiber material 2812 layers using the nozzle 2800. FIG. 28*d* shows an iron tool 2820 being used to compact and/or further bond the matrix and fiber material layers of FIG. 28*c* together. The resulting material stack 2830 may be thinner (as shown) or it may be the same height as the stating material stack. The resulting material 2830 may be more homogenous than the starting material stack. The iron tool 2820 can create pressure or it can be heated with optional heating elements 2822. The iron tool can be mounted to a motion system such as a gantry and can have 1, 2, 3, 4, 5, 6, or more axes of motion. For example, a 5 axis iron can be used to compact or bond layers on parts with non-planar or irregular shapes.

In addition to the heating element(s) 2822, the iron tool 2820 can have a smooth and rounded outer surface, as shown. The resulting material stack 2830 can be a merged (composite) ironed material with improved characteristics. In some cases, the iron tool 2820 can be used selectively on internal structures of the object being fabricated to improve internal structural characteristics of the object. Further, use of the iron tool 2820 can provide better control of shape and surface finish for the object being fabricated. For example, the iron tool 2820 can be employed on exterior surfaces of the fabricated object to improve its appearance. Moreover, providing a system with a separate iron tool 2820 allows tailoring the path of the material ironing/merging process to that of the lay down path, which can have significant advantages for non-planar paths.

Other tools, including other of nozzles for delivering different types of materials, can also be employed in a depositing system. FIG. 29*a* shows a hollow tube of matrix material 2900. For example, the tube of matrix material 2900 can be a hollow thermoplastic filament. FIG. 29*b* shows a fiber bundle 2902 running through the center of the matrix material tube 2900 of FIG. 29*a*. For example, the fiber bundle 2902 structural fibers in the center of a hollow thermoplastic filament. In some implementations, these structural fibers are not continuous, but are composed of fibers between 3 mm and 25 mm long each. In some cases, structural fibers can be a woven mat or strip of woven fabric, or composed of discontinuous patches.

FIG. 29*c* shows a deposition system feeding the matrix material tube 2900 plus the fiber bundle 2902 through a nozzle 2910, depositing them together such that the matrix material 2900 and fiber bundle 2902 fuse to become a composite material 2920 as they exit the nozzle. The nozzle 2910 can also be used to press down and heat the composite material 2920 as it is delivered, or a separate ironing tool can be used, as described above. Thus, the fibers and matrix can be delivered in such a fashion that they become nearly homogenous. FIG. 29*d* shows a cross section of a composite material structure 2930 that can be created using the system of FIG. 29*c*, where each of the three layers of the structure 2930 have been merged to create a nearly homogenous material.

Figure 30A:
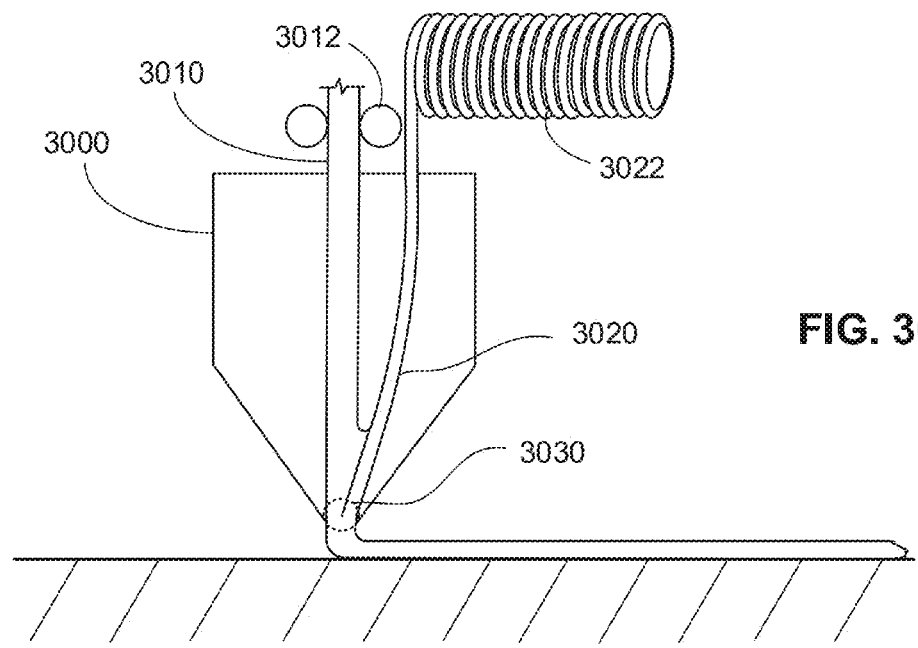
FIGS. 30a and 30b show examples of singular nozzles used for both fiber and matrix delivery in a material deposition system.
Figure 30B:
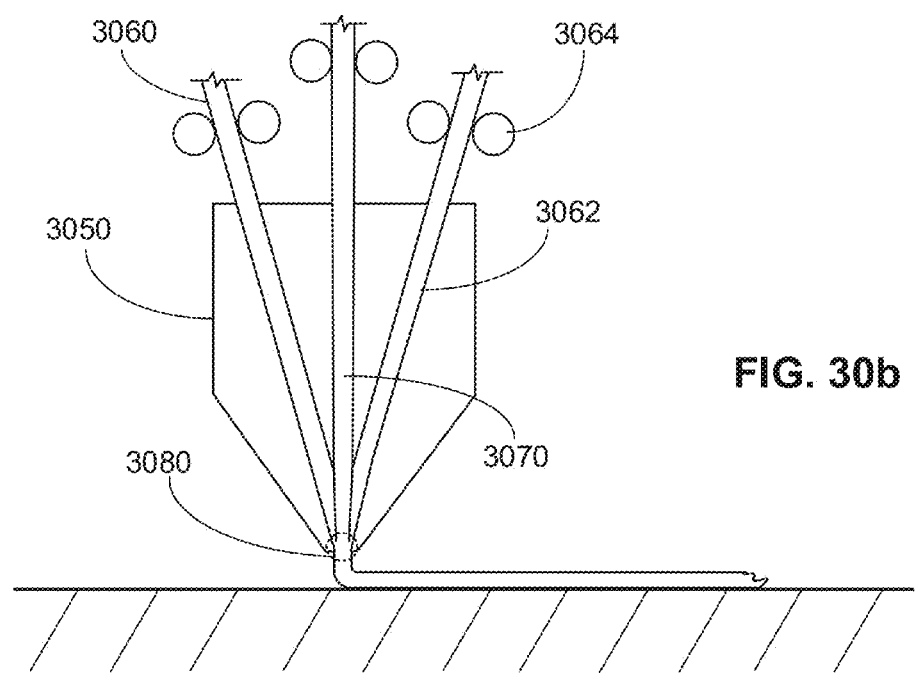

In other implementations, the matrix and fiber are kept separate, then mixed or infiltrated in the nozzle. FIGS. 30*a* and 30*b* show examples of singular nozzles used for both fiber and matrix delivery in a material deposition system. In FIG. 30*a*, a nozzle 3000 delivers a matrix material 3010 (e.g., a thermoplastic filament) fed by feed rollers (e.g., feed roller 3012). The nozzle 3000 also delivers a fiber material 3020 (e.g., yarn) provided by a spool 3022. The fiber material 3020 and the matrix material 3010 are mixed in a mixing zone 3030.

In FIG. 30*b*, a nozzle 3050 delivers a first matrix material 3060 (e.g., a thermoplastic filament) and a second matrix material 3062 (e.g., a thermoplastic filament) which are both fed by feed rollers (e.g., feed roller 3064). The nozzle 3000 also delivers a fiber material 3070 (e.g., yarn) to be infiltrated with the matrix materials 3060, 3062 in an infiltration zone 3080. Other types of matrix and fiber materials can also be used.

For example, thread or yarn or strip or wood fiber can be fed in parallel with one or more streams of thermoplastic. As described above, a roller can be used to mush plastic into the fiber material (e.g., thread). Further, a nozzle with multiple holes can be used, with the fiber (e.g., thread) delivered through the center of the nozzle to a central orifice of the nozzle, and several surrounding orifices in the nozzle can be used to deposit thermoplastic and impregnate thread with thermoplastic. Moreover, in some implementations, the fiber material can be yarn woven of structural fibers plus thermoplastic fibers, which can be fed through a heated nozzle, and the thermoplastic fibers can be melted and impregnate into structural fibers.

Such uses of structural fibers and/or different types of thermoplastics can be employed in the various systems described above. In some implementations, composite parts can be created via FDM processes that use two different PET (Polyethylene Terephthalate) polymers in a single filament. One material in the filament is melted, and the other material can be fibers with a higher melting point so they don't melt, even though both materials can be constructed of the same monomer or even different versions of the same basic polymer. The fibers can be thin enough that they "flow" with the melted material. The resulting structures made of this material can be completely recyclable because they are 100% PET even though they contain two sub-types.

Excess materials from additive manufacturing and failed 3D prints can be recycled and used as input material for further 3D printing. Such a system of using recycled thermoplastic materials and thermoplastic fibers in the additive manufacturing process can result in a composite material that has higher strength than would be achievable using the thermoplastic material alone. Using both a lower melting point material as matrix material and a higher melting point material as the fiber can provide the ease of deposition from the lower melting point material, but also provide the strength and reinforcement properties from the higher melting point material. For example, longer chain polymers can be used as the fiber, but since they have the same monomer as the matrix, when recycled, these longer chain polymers can be shortened in the recycling process, thereby lowering their melting point and making them suitable as the matrix material.

Various types of materials can be used in this approach. For example, paraffin wax (which melts at a low temperature) has essentially the same monomer as polyethylene (which is more cross-linked and melts at a higher temperature), which has the same monomer as high density polyethylene (which has even longer molecules, and so a still higher melting point), which has the same monomer as ultra-high density polyethylene (which has very long chains, and so a still higher melting point and increased strength). For various such materials, during the recycling process, one can perform chemical synthesis or modifications to create two different materials from the same feedstock, one material with a lower melting point (to be used as the matrix material) and the other material with a higher melting point (to be used as the fiber material).

For example, referring again to FIG. 29*b*, the matrix material 2900 can be composed of a first polymer having a first melting temperature, and the fiber bundle 2902 can be composed of a second polymer having a second melting temperature that is higher than the first melting temperature, but both the matrix material 2900 and the fiber bundle 2902 can be formed from the same monomer. The more fibrous nature of the second polymer 2902 causes it to have a higher glass transition temperature than the glass transition temperature of the first polymer, and the FDM system can feed both components of the composite material through the same heated nozzle, such as shown in FIG. 29*c*. By controlling the temperature of the heated nozzle, the matrix material 2900 can be melted and deposited, while the fiber bundle 2902 can be softened for deposition, but not fully melted, thus providing added strength in the composite material. Moreover, since both are made of the same monomer, the extruded material can be recycled and used in the same FDM system again.

Thus, the composite material used in an additive manufacturing system can be fully recyclable and used repeatedly in additive manufacturing. In some implementations, the composite material is continuously reusable, while still providing sufficient strength characteristics because of the composite nature of the material. Other composite materials are also possible in various implementations, for example, related composite material can be created as a polyethylene composite of LDPE (Low Density Polyethylene), HDPE (High Density Polyethylene), or UHMW (Ultra High Weight polyethylene) matrix plus Spectra brand UHMW fibers. Further, using the layer interlocking techniques described above, the manufactured objects can be made even stronger.

The other systems described above can also be used to deliver such recyclable matrix and fiber materials, such as the systems of FIGS. 25a, 25b, 25h, 25i, 26a-26d, 27a, 28a-28d, and 30a-30b. The various systems and tools described can combined in one or more automated systems for composite part fabrication. These can in include 3D printer hardware with a tool changer system to change between and operate the tools shown and described, where such tool changer systems can be similar to the traditional tool changers used with CNC (Computer Numerical Control) machines and robot arms today. In addition, various automated systems, in accordance with this disclosure, can also use computer controlled machinery (e.g., one or more robot arms or machinery such as that used in a moving platen or shuttle table system) to move prepreg sheets (e.g., composite fabric pre-impregnated with slow-cure resin or thermoplastic) to a part being built.

Figure 31A:
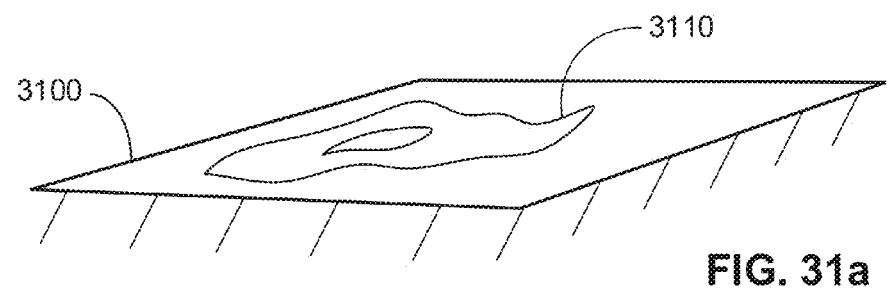
FIGS. 31a-31c show aspects of an automated process for fabricating parts from "prepreg" sheets.
Figure 31B:
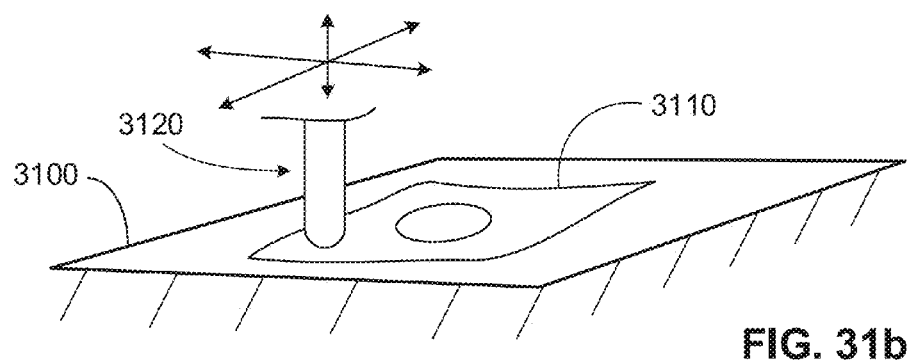
Figure 31C:
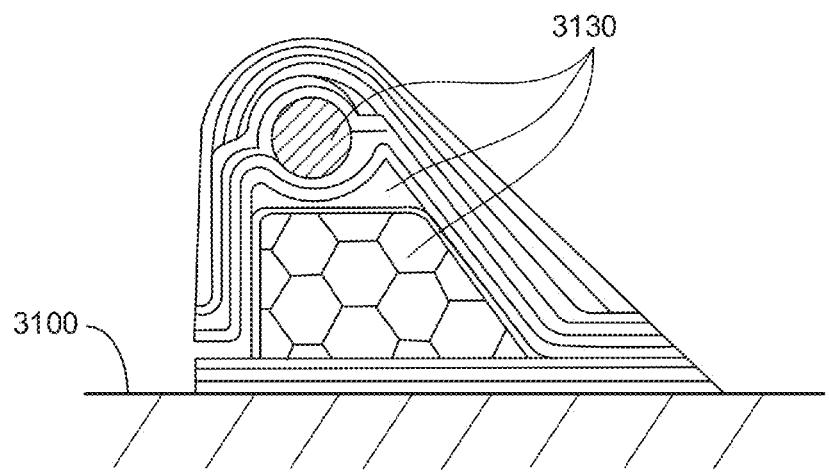

FIGS. 31a-31c show aspects of an automated process for fabricating parts from prepreg sheets (e.g., cutouts of composite fiber material, which can be pre-impregnated with a matrix material such as a resin or thermoplastic). FIG. 31a shows a layer 3110 of a part sitting on a build platform 3100. A whole sheet of prepreg can be attached to a movable platen at the corners. Layers or flat sections may be cut to size/shape with a knife, water jet, laser or some other cutter. The movable platen and prepreg sheet can be placed against a cutting surface during the cutting operation. In some implementations, the movable platen with prepreg can move to the part. In other implementations, the cutting surface can move out of the way and the part can move upward to contact the new cut layer of prepreg. Note that small sections of the new layer may be left attached to the parent sheet of prepreg so that it can still be moved as a unit. The excess boundary can then be removed later, such as described below in connection with FIGS. 32a-32f.

The layer 3110 shown in FIG. 31a is shown loose and not completely flat which may be the case before layers are combined to make a part. Various types of automation systems, such as robot arms and/or roller/web systems for horizontal transfer, which are used for film and fabric cutting, can be used with prepreg in an additive manufacturing system to fabricate parts from composite materials and achieve faster builds, which can have non-planar layers and fiber orientations.

FIG. 31b shows additional actions in an automated composite part fabrication process. A robot arm (not shown) or some other system moves the layer 3110 from FIG. 31a into place on the part on the build platform 3100 where it can become the next layer of the part to be built. Next, an automated iron tool 3120 can tack the layer in place at certain initial locations to prevent the material from moving. Then the iron 3120 can finish ironing the rest of the surface of this layer. The ironing process can heat a matrix material in the prepreg to melt it and adhere it to the part being built, and to itself. In other implementations, the matrix can be adhered by pressure, by UV (ultraviolet) light or by chemical reaction. Note that layers can be planar or non-planar.

Further, in some implementations, a material deposition system (not shown, but such as described above) can deposit other types of materials in between fiber prepreg layers. Other materials deposited between prepreg layers can be deposited via an FDM style nozzle in planar or non-planar paths, using the systems and techniques described above, or they can be pre-fabricated pieces that are put into place, having been made by SLS, SLA, DMLS, molding or some other process.

In some implementations, the iron tool 3120 can have a long reach ironing head (as shown) to reach through holes in any pre-fabricated sections to tack (secure) them to the underlying prepreg layer(s). In some implementations, a subtractive process can also be used between the addition of layers or materials or after the additive layer process is complete. For example a milling head can be used to precisely trim edges of composite layers.

FIG. 31c shows a front view of a part that can be fabricated by processes shown and described in connection with FIGS. 31a and 31b. A different support material 3130 is shown in some areas, which can help in getting the prepreg layers to take on a desired shape as they are placed and ironed or cured on the part. Thus, combining multiple types of tools and material delivery techniques in an automated additive manufacturing system can improve the ability to create new and different products.

Figure 32A:
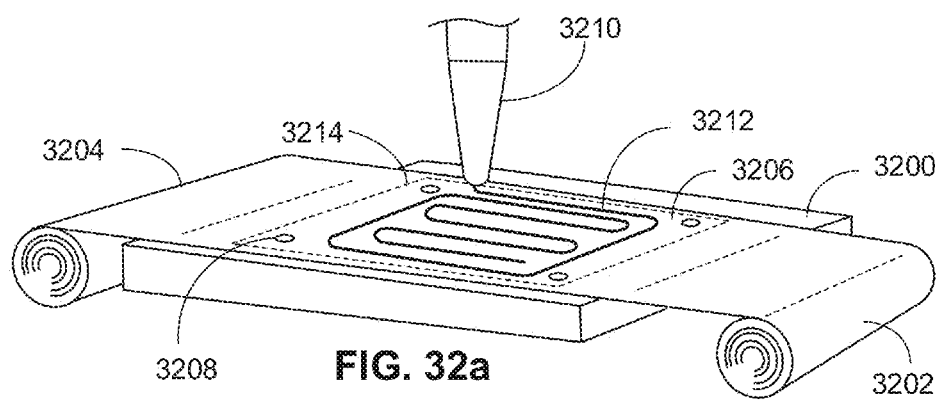
FIGS. 32a-32g show aspects of another automated method for constructing composite parts.

FIGS. 32a-32g show aspects of another automated method for constructing composite parts. A roll-to-roll process system can be included. FIG. 32a shows a single layer being fabricated. A thin sheet or film of polymer 3206 can be fed off of a stock roll of polymer 3202 over a pre-build base 3200. The pre-build base 3200 can support the polymer sheet 3206 while a fiber dispensing system 3210, which can include a nozzle, deposits fiber 3212 in a pattern onto the polymer sheet 3206. The fiber dispensing system 3210 can include heater element(s) that heat the fiber 3212 to assist in delivery. The fiber 3212 may be hot enough to melt a small portion of the polymer 3206 where it touches the fiber 3212 and bond to the fiber as it re-solidifies, thus attaching the fiber 3212 to the polymer 3206, which serves as the matrix.

It can also be possible to use a tacky polymer and non-heated fiber such that the fiber adheres to the tacky polymer well enough to hold it in place. The fiber only needs to be held to the polymer well enough that the fiber pattern is maintained for a short period pending the next operation. Once the fiber 3212 is attached to the polymer 3206 in a suitable pattern, the fiber 3212 can be severed from the fiber deposition system 3210. The layer can thus be made up of the sheet of polymer plus the fiber pattern.

A take up roll 3204 can serve to maintain tension on the polymer sheet 3206 while the fiber pattern is being deposited. Optional locating holes 3208 can serve to locate the polymer sheet 3206 and/or locate the complete layer in subsequent fabrication operations. Once the fiber pattern is complete the layer may be trimmed. Trimming can be accomplished with a drag-knife (not shown), laser cutter, or some other cutting system. In some implementations, optional trimming lines 3214 can be used to facilitate trimming.

Figure 32B:
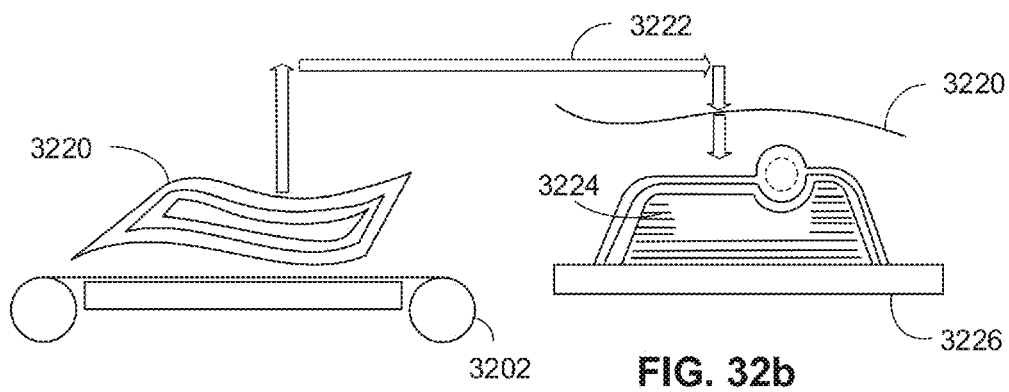

FIG. 32b shows a transfer process in which the new layer (the polymer sheet section plus the fiber pattern) 3220 can be moved 3222 to a build base 3226 where a part can be built by the addition of multiple layers plus optionally support material 3224. Each flat layer with fiber pattern can be added to the part flat or it may take on a non-planar shape as it is formed over other previously added layers plus support material. The take up roll is then rotated to advance the polymer sheet to expose a new section so the process can be repeated to construct a new layer. Multiple layer fabrication stations can work in parallel so that a part being fabricated on the build base 3226 can have layers added from more than one station and layers can be added faster than the time required to fabricate each layer.

Figure 32C:
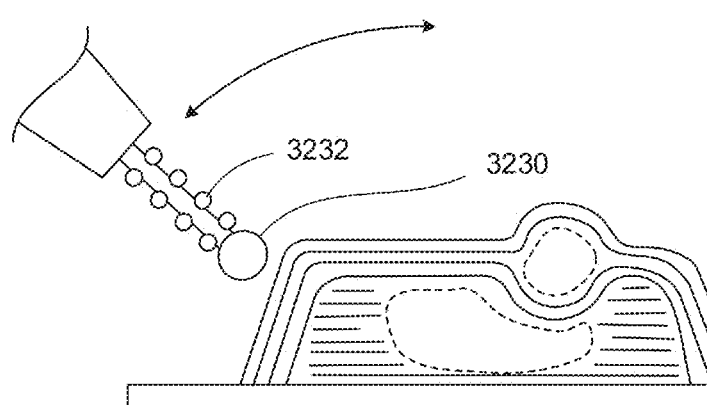

FIG. 32*c* shows another version of an iron tool 3230, which can be used to traverse over the surface of each new layer, incrementally pressing the area of the new layer onto the build plate 3226 or previously fabricated layers or structure. The iron tool 3230 is heated, e.g., with heating elements 3232, and it can heat the fibers and polymer and melt or otherwise adhere the layer to the underlying structure. The polymer may flow into the fibers (both of the current layer and the layer below) and the fibers may be pushed into the polymer such that the fibers may become completely encased and embedded in the polymer and the polymer may become filled with fibers. The iron 3230 can be controlled by an automated gantry or robot arm and can have 3, 4, 5, or more axes of motion. A 5 axis iron system may be able to move the iron 3230 over all areas of the surface of the new layer including getting under overhangs. The new layer may take a flat (planar) form or it may take on a non-planar form depending upon the shape of the previously fabricated layers and the shape of the part being made.

Figure 32D:
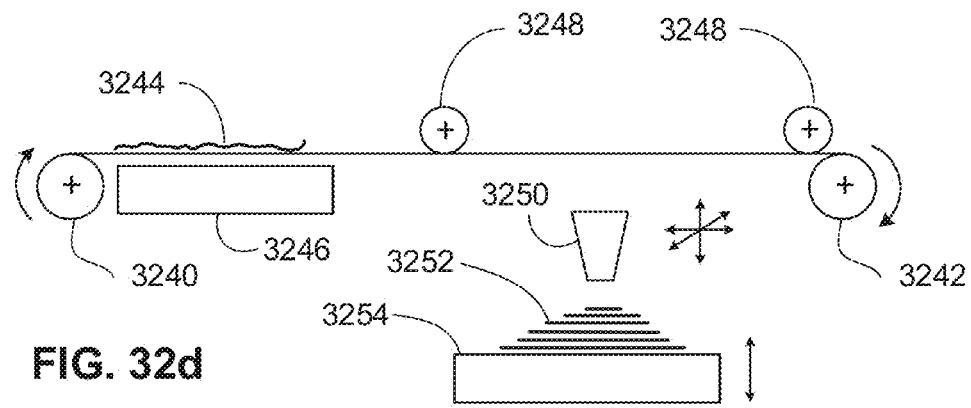

FIG. 32*d* shows a different but related version of a composite part fabrication system. A polymer film is fed from a polymer film stock roller 3240 to a take up roll 3242. A layer consisting of a fiber pattern 3244 deposited on the polymer film can be formed at a layer build station, which can include a support plate 3246.

Once the layer is complete, the rollers 3240, 3242 can turn in order to transport the layer over to a part build platform 3254. The build platform 3254 can have other previously made layers 3252 with fibers or layers of dissolvable or removable or non-removable support material on it, such as can be built using an FDM nozzle 3250 in an extruder system, such as described above. The build platform 3254 may raise up to touch the new layer or it may push into the new layer to stretch it tight between optional auxiliary rollers 3248. An optional material deposition system, such as FDM nozzle 3250, can be used to deposit support material structures in between or on top of fiber layers. Support material structures may be dissolvable or removable or permanent.

Figure 32E:
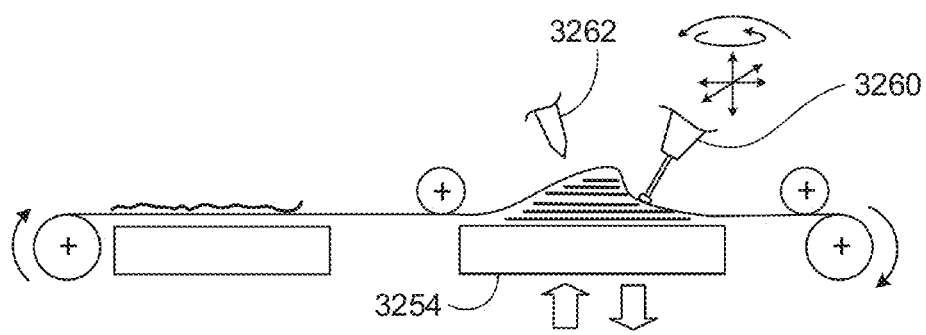

FIG. 32*e* shows an iron tool 3260 attaching a new layer to a part being built. The layer being attached is taking on a non-planar shape as it is added on to a set of planar layers and support material layers. The iron tool 3260 can be a five axis tool using the systems and techniques described above. In addition, a trim tool 3262 can be used, where the trim tool 3262 can also be a five axis tool using the systems and techniques described above.

Figure 32F:
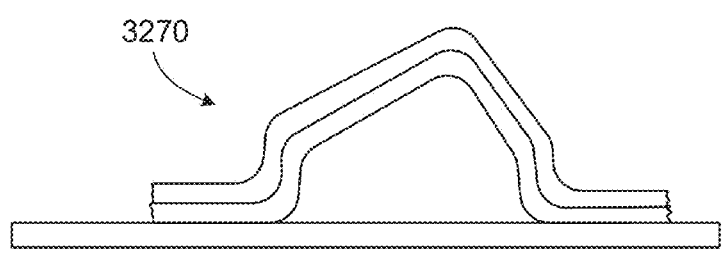

FIG. 32*f* shows a competed part 3270 with support material removed. A computerized planning system can be used to plan the orientation of polymer and fibers of each layer and their transformation from flat state to (optionally) not-flat state as they are ironed or otherwise fused to the part being made. Layers can also be fused together, compacted or cured by vacuum bagging, heating of the whole part and/or pressurization.

Figure 32G:
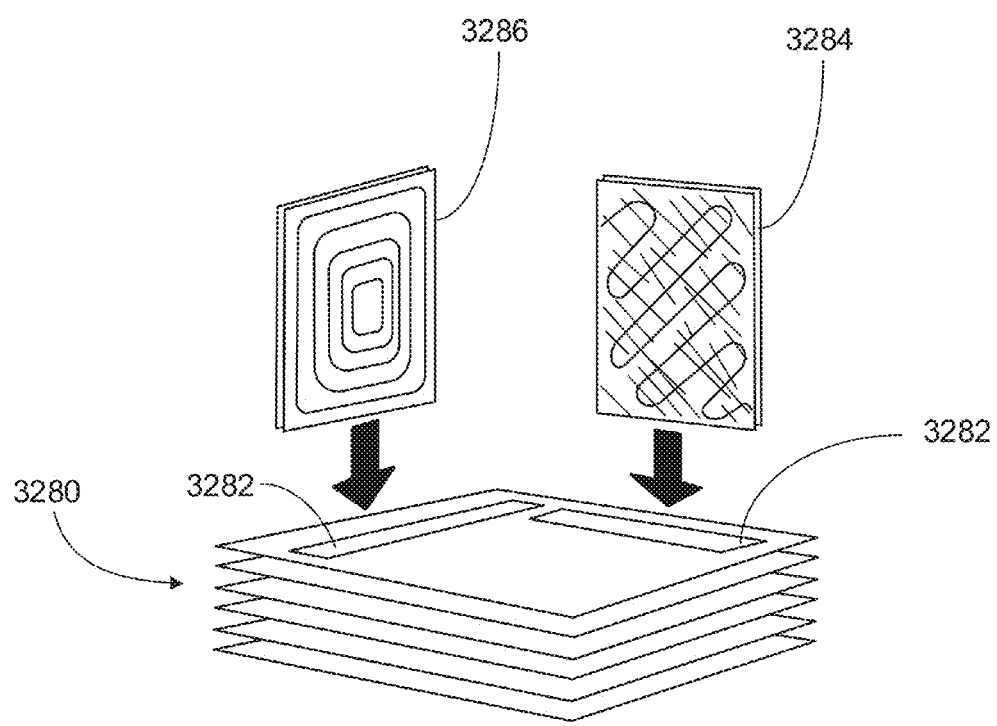

FIG. 32*g* shows a part made of multiple layers 3280 of polymer plus fibers. Slots 3282 left in some of the layers allow additional layers 3284, 3286 to be added by being slid into the slots 3282 in a vertical orientation. The resulting part can be completed by heating and/or vacuum bagging which can allow the polymer in the layers 3284, 3286 that were inserted into the slots 3282 to fuse with the other layers. In this way, fibers can be included in parts that are transverse to the fibers in surrounding layers.

The composite fabrication techniques described herein can, in some implementations, also be implemented with wood fiber, wood strips, bamboo fiber, bamboo strips, grass fiber, cotton, silk, other natural fibers, fungus based fiber, and wood-based, fungus based, seaweed based or other biologically derived matrix materials (such as lignin or chitin) or bio-polymers such as PLA (polylactic acid). Using biologically based materials together with deposition processes described herein may enable construction of composite materials which are biodegradable, compostable, have neutral carbon footprint, or have a negative carbon footprint, for example if items made with these processes are charred to carbon or charcoal at the end of their useful life and the charcoal used in agriculture, filtration or other use, which enables long-term sequestration of the carbon contained in the materials.

Implementations of the subject matter described in this specification can be implemented in combination with digital electronic circuitry, or computer software, firmware, or hardware. Implementations of the subject matter described in this specification can be implemented in an additive manufacturing system that uses one or more modules of computer program instructions encoded on a computer-readable medium for execution by, or to control the operation of, data processing apparatus. The computer-readable medium can be a manufactured product, such as hard drive in a computer system or an optical disc sold through retail channels, or an embedded system. The computer-readable medium can be acquired separately and later encoded with the one or more modules of computer program instructions, such as by delivery of the one or more modules of computer program instructions over a wired or wireless network. The computer-readable medium can be a machine-readable storage device, a machine-readable storage substrate, a memory device, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, a runtime environment, or a combination of one or more of them. In addition, the apparatus can employ various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, implementations of the subject matter described in this specification can be implemented using a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations of the subject matter described in this specification can be implemented using a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described is this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other.

While this specification contains many implementation details, these should not be construed as limitations on the scope of the invention or of what may be claimed, but rather as descriptions of features specific to particular implementations of the invention. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the invention have been described. Other implementations are within the scope of the following claims.

What is claimed is:

1. A method comprising:
   providing a matrix material and a fiber material separate from the matrix material to a fused deposition modelling (FDM) three dimensional (3D) printer; and
   delivering the matrix material and the fiber material to a printing location of the FDM 3D printer while maintaining separation of the fiber material from the matrix material up to the printing location of the FDM 3D printer, wherein the delivering comprises melting the matrix material and embedding the fiber material within the matrix material; and
   wherein the matrix material comprises a first polymer, the fiber material comprises a second polymer, and both the first polymer and the second polymer are formed from a same monomer, but the first polymer has a lower melting temperature than the second polymer.

2. The method of claim 1, wherein the providing comprises feeding the first polymer and the second polymer together, the first polymer forming a hollow tube that surrounds but is separate from the second polymer, and the delivering comprises feeding the first and second polymers through a heated nozzle at a temperature that melts the first polymer but not the second polymer, the first polymer having a lower glass transition temperature than a glass transition temperature of the second polymer.

3. The method of claim 1, wherein the delivering comprises:
   delivering the matrix material with a first tool comprising a heated nozzle; and
   delivering the fiber material with a second tool, separate from the first tool.

4. The method of claim 3, wherein the second tool comprising a spool and a heated roller, and delivering the fiber material comprises:

re-melting previously delivered matrix material using the heated roller, and pressing the fiber material into the re-melted matrix material using the heated roller.

5. The method of claim 1, wherein the delivering comprises delivering the matrix material and the fiber material with a single tool.

6. The method of claim 1, wherein the delivering comprises:

delivering a first layer of the matrix material;

delivering a layer of the fiber material over the first layer of the matrix material;

delivering a second layer of the matrix material over the layer of fiber material; and compacting and bonding the first and second layers of matrix material and the layer of fiber material together using an iron tool.

7. A method comprising:

providing a matrix material and a fiber material separate from the matrix material to a fused deposition modelling (FDM) three dimensional (3D) printer; and delivering the matrix material and the fiber material to a printing location of the FDM 3D printer while maintaining separation of the fiber material from the matrix material up to the printing location of the FDM 3D printer, wherein the delivering comprises melting the matrix material and embedding the fiber material within the matrix material;

wherein the delivering comprises delivering the matrix material and the fiber material with a single tool; and wherein the single tool comprises a heated nozzle and a roller on a swivel system, and the delivering comprises:

delivering the matrix material with the heated nozzle; and delivering the fiber with the roller on the swivel system.

8. The method of claim 7, wherein the matrix material comprises a first polymer, the fiber material comprises a second polymer, and both the first polymer and the second polymer are formed from a same monomer, but the first polymer has a lower melting temperature than the second polymer.

9. A method comprising:

providing a matrix material and a fiber material separate from the matrix material to a fused deposition modelling (FDM) three dimensional (3D) printer; and delivering the matrix material and the fiber material to a printing location of the FDM 3D printer while maintaining separation of the fiber material from the matrix material up to the printing location of the FDM 3D printer, wherein the delivering comprises melting the matrix material and embedding the fiber material within the matrix material; and wherein the delivering comprises depositing one or more first material segments with at least one first locking portion and one or more second material segments with at least one second locking portion with the at least one second locking portion having a shape that is defined by a shape of the at least one first locking portion, whereby the at least one second locking portion forms an interlock with the at least one first locking portion, and wherein the first and second material segments each comprise a continuous material, and the interlocked first and second material segments form an object having comparable resistance to delamination or breakage in all directions.

10. The method of claim 9, wherein the one or more first material segments form a first layer, the one or more second material segments form a second layer, and each of the first and second layers are non-planar.

11. The method of claim 10, wherein each of the first and second layers are formed from the matrix material comprising a first polymer and the fiber material comprising a second polymer, and both the first polymer and the second polymer are formed from a same monomer, but the first polymer has a lower melting temperature than the second polymer.

12. The method of claim 11, wherein the providing comprises feeding the first polymer and the second polymer together, the first polymer forming a hollow tube that surrounds but is separate from the second polymer, and the delivering comprises feeding the first and second polymers through a heated nozzle at a temperature that melts the first polymer but not the second polymer, the first polymer having a lower glass transition temperature than a glass transition temperature of the second polymer.

13. The method of claim 9, wherein the delivering comprises:

delivering the matrix material with a first tool comprising a heated nozzle; and delivering the fiber material with a second tool, separate from the first tool.

14. The method of claim 13, wherein the second tool comprising a spool and a heated roller, and delivering the fiber material comprises:

re-melting previously delivered matrix material using the heated roller, and pressing the fiber material into the re-melted matrix material using the heated roller.

15. The method of claim 9, wherein the delivering comprises delivering the matrix material and the fiber material with a single tool.

16. The method of claim 15, wherein the single tool comprises a heated nozzle and a roller on a swivel system, and the delivering comprises:

delivering the matrix material with the heated nozzle; and delivering the fiber with the roller on the swivel system.

* * * * *